United States Patent
Kandlikar et al.

(10) Patent No.: US 12,349,313 B2
(45) Date of Patent: Jul. 1, 2025

(54) COOLING DEVICE HAVING A BOILING CHAMBER WITH SUBMERGED CONDENSATION AND METHOD

(71) Applicants: Satish G. Kandlikar, Rochester, NY (US); Maharshi Shukla, West Henrietta, NY (US)

(72) Inventors: Satish G. Kandlikar, Rochester, NY (US); Maharshi Shukla, West Henrietta, NY (US)

(73) Assignee: Rochester Institute of Technology, Rochester, NY (US)

( * ) Notice: Subject to any disclaimer, the term of this patent is extended or adjusted under 35 U.S.C. 154(b) by 172 days.

(21) Appl. No.: 17/981,256

(22) Filed: Nov. 4, 2022

(65) Prior Publication Data
US 2023/0147067 A1 May 11, 2023

Related U.S. Application Data

(60) Provisional application No. 63/276,313, filed on Nov. 5, 2021.

(51) Int. Cl.
*H05K 7/20* (2006.01)
(52) U.S. Cl.
CPC ......... *H05K 7/20318* (2013.01); *H05K 7/203* (2013.01); *H05K 7/20327* (2013.01); *H05K 7/20818* (2013.01)
(58) Field of Classification Search
CPC ........... H05K 7/20818; H05K 7/20327; H05K 7/203; H05K 7/20318
See application file for complete search history.

(56) References Cited

U.S. PATENT DOCUMENTS

| | | | |
|---|---|---|---|
| 10,123,454 B2 * | 11/2018 | Saito | H05K 7/20236 |
| 10,349,561 B2 | 7/2019 | Farshchian et al. | |
| 10,349,563 B2 | 7/2019 | Farshchian et al. | |
| 10,542,641 B2 | 1/2020 | Samadiani et al. | |
| 10,947,133 B2 | 3/2021 | Constantz | |
| 11,109,517 B2 | 8/2021 | Farshchian et al. | |
| 11,116,113 B2 | 9/2021 | Chiu et al. | |
| 11,432,431 B1 * | 8/2022 | Embleton | G06F 1/20 |
| 2006/0162898 A1 * | 7/2006 | Reyzin | H01L 23/473 |
| | | | 257/E23.098 |
| 2013/0056178 A1 | 3/2013 | Matsunaga et al. | |
| 2015/0216079 A1 * | 7/2015 | Kondou | F28D 15/0266 |
| | | | 165/104.21 |

(Continued)

FOREIGN PATENT DOCUMENTS

EP 2967004 A1 1/2016

OTHER PUBLICATIONS

Liu et al., "Experimental Investigations on Heat Transfer Characteristics of Direct Contact Liquid Cooling for CPU," Buildings, 12(913):1-16 (2022).

(Continued)

*Primary Examiner* — Nelson J Nieves
(74) *Attorney, Agent, or Firm* — Bond, Schoeneck & King, PLLC; Joseph M. Noto

(57) ABSTRACT

A device and method including a boiling chamber in which boiling occurs in a pool of liquid and condensation occurs in the same chamber to remove the heat from the condensation process of the bubbles generated during the boiling process mainly through submerged condensation are disclosed.

20 Claims, 14 Drawing Sheets

(56) References Cited

U.S. PATENT DOCUMENTS

| | | | |
|---|---|---|---|
| 2016/0033212 A1* | 2/2016 | Wang | F28F 13/187 |
| | | | 165/104.21 |
| 2016/0073548 A1* | 3/2016 | Wei | H05K 7/203 |
| | | | 165/104.21 |
| 2017/0064862 A1* | 3/2017 | Miyoshi | H01L 23/32 |
| 2017/0122629 A1* | 5/2017 | Burk | F28F 13/185 |
| 2018/0084673 A1* | 3/2018 | Asai | H05K 7/20936 |
| 2018/0092243 A1* | 3/2018 | Saito | H01L 23/473 |
| 2018/0245863 A1* | 8/2018 | Kusano | F28F 13/14 |
| 2018/0303006 A1 | 10/2018 | Chainer et al. | |
| 2019/0035713 A1* | 1/2019 | Prajapati | H05K 7/20336 |
| 2019/0203983 A1* | 7/2019 | Jeon | F25B 21/02 |
| 2019/0277584 A1* | 9/2019 | Cheng | H05K 7/20327 |
| 2019/0357387 A1* | 11/2019 | Peterson | H05K 7/20327 |
| 2020/0211925 A1* | 7/2020 | Sato | G03B 21/16 |
| 2021/0022265 A1* | 1/2021 | Inagaki | H05K 7/20336 |
| 2021/0156620 A1* | 5/2021 | Lin | F28D 15/0266 |
| 2021/0219454 A1 | 7/2021 | Cheng et al. | |
| 2021/0321538 A1* | 10/2021 | Aoki | H01L 23/34 |
| 2021/0368655 A1* | 11/2021 | Gao | H05K 7/20836 |
| 2022/0124945 A1* | 4/2022 | Liu | H05K 7/20309 |
| 2022/0167523 A1 | 5/2022 | Dumas et al. | |
| 2022/0167528 A1* | 5/2022 | Joshi | H05K 7/20936 |
| 2022/0187023 A1* | 6/2022 | Kang | F28D 15/02 |
| 2022/0369493 A1* | 11/2022 | Alissa | H05K 7/20818 |
| 2023/0138653 A1* | 5/2023 | Joshi | B23P 15/26 |
| | | | 62/515 |

OTHER PUBLICATIONS

Zhou et al., "A Two-Phase Liquid Immersion Cooling Strategy Utilizing Vapor Chamber Heat Spreader for Data Center Servers," Applied Thermal Engineering 210:118289 (2022) [Need PDF].

Judge, "Intel announces $700m Oregon data center sustainability lab, teases immersion cooling system," Data Center Dynamics, https://www.datacenterdynamics.com/en/news/intel-announces-700m-oregon-data-center-sustainability-lab-teases-immersion-cooling-system/ (Accessed Aug. 2, 2022).

International Search Report and Written Opinion for International Patent Application No. PCTUS2249025 (mailed Feb. 17, 2023).

* cited by examiner

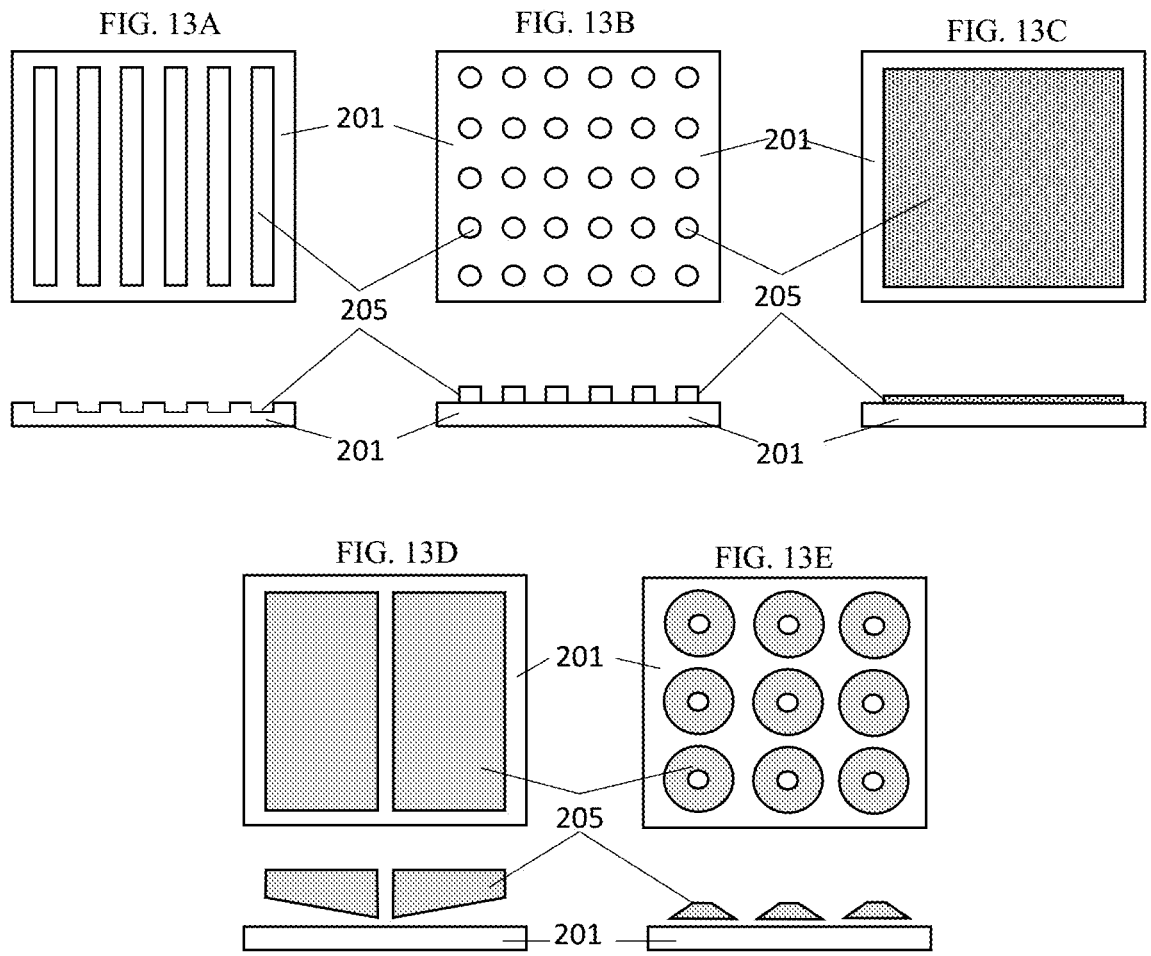

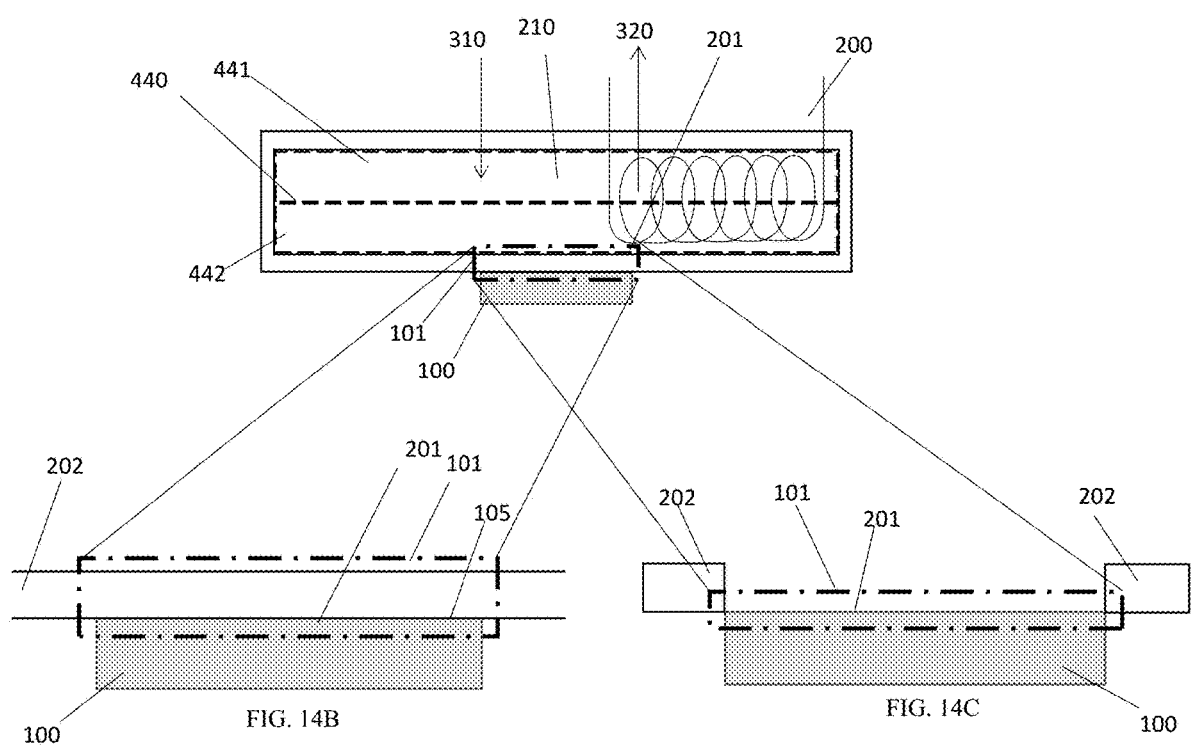

COOLING DEVICE HAVING A BOILING CHAMBER WITH SUBMERGED CONDENSATION AND METHOD

CROSS REFERENCE

This application claims the benefit of the filing date of U.S. Provisional Patent Application Ser. No. 63/276,313, filed Nov. 5, 2021, which is hereby incorporated by reference in its entirety.

FIELD

The present disclosure relates to a cooling device having a boiling chamber and method for high heat removal utilizing submerged condensation.

BACKGROUND

High heat removal is needed in many applications, such as cooling CPUs, electronic devices and cold plates in computers and data servers. In the past, air coolers were employed that relied on using a finned heat sink that was cooled by natural convection or forced convection of air. These devices are not very efficient and are not used for high heat rate removal from the limited surface areas of the device. Air cooling is replaced by water in a closed loop cooling the device and dissipating it to ambient air. Other forms of cooling technologies based on water cooling and air cooling are implemented. They suffer through low heat removal capability or excessive power consumption, or coolant pressure drop. In addition, heat spreaders, heat pipes and vapor chambers were employed. A heat spreader receives heat from a device and spreads it over a larger cooling area where a cooling medium can remove it. The area increase provided by a heat transfer is responsible for the increased heat removal rate. The heat transfer in the spreader itself can occur in one or more of the heat transfer modes, including conduction and combined evaporation and conduction. Another device that is commonly employed is vapor chamber. It consists of a liquid section and a vapor section. The liquid in the liquid section is heated from heat supplied by the device being cooled and either boils if the liquid level in the liquid section above the heated region of the vapor chamber is high enough to sustain pool boiling or evaporates if the liquid forms an evaporating film on the heat transfer surface. The vapor chambers relied on the evaporation of a liquid on porous or capillary structures and the liquid was returned from the condensing surfaces by surface tension force in capillary wick structures. In a vapor chamber, the liquid boils from the heat source, which is being cooled, and the vapor condenses on the condensing surfaces of an externally cooled cooling coil placed inside the vapor chamber. The condensing surfaces are placed in the vapor section of the vapor chamber. The liquid return in a thermosiphon is accomplished by placing the condensing coil at a higher gravitational elevation causing the liquid to flow back to the evaporator section by gravity, where evaporation causes heat removal from the heat source. There is a need for a cooling device that can meet the constraint of removing high heat rate from a heat source, such as a CPU, etc. In addition, the processes employed to transfer heat from the heat source to a cooling medium need to be efficient so as to introduce as low a temperature difference as possible between the temperature of the surface being cooled and the available cooling medium temperature. Another constraint that is imposed is low or no pumping power consumption in the cooling device to accomplish this heat transfer from the heat source. Another major constraint that is faced is the compactness desired of the cooling device which prevents from employing tall vapor sections that can accommodate larger condensing coils to remove the high heat rate. Another constraint that is introduced in the design of a cooling device is its compactness, and a short height is needed to meet the demands of accommodating the cooling device in applications such as CPU coolers in the servers of a data center. A cooling device that meets these constraints is needed to meet the challenges of future electronic systems, data centers, high power laser-diodes and other devices facing these constraints.

SUMMARY

In accordance with an aspect of the present disclosure, there is provided a cooling device having a boiling chamber, including a thermally conductive boiling chamber having a section configured to contain liquid, a section configured to contain vapor in contact with the section configured to contain liquid, a heating section in communication with an external heat source over a contact area and the section configured to contain liquid, and a cooling element configured to communicate with an external cooling source and disposed in at least the section configured to contain liquid, wherein when liquid is present in the section configured to contain liquid and heated by the heating section resulting in boiling and vapor generation in the form of bubbles within the liquid, heat is exchanged between the liquid and the cooling element and between the liquid and the bubbles, resulting in submerged condensation, such that the heat transfer rate in the heating section is at least 50 Watts.

In accordance with another aspect of the present disclosure, there is provided a boiling process for high heat dissipation, including heating with an external heat source liquid within a partially filled thermally conductive sealed boiling chamber; and cooling with an external cooling source a cooling element at least partially submerged in the liquid within the boiling chamber, wherein heating the liquid causes boiling of the liquid and vapor generation resulting in the formation of vapor bubbles within the liquid and exchanging heat (a) between the liquid and the cooling element and (b) between the liquid and the vapor bubbles resulting in submerged condensation, such that the heat transfer rate to the boiling chamber is at least 50 Watts.

In accordance with yet another aspect of the present disclosure, there is provided a cooling device having a plain surface (defined as a surface without any enhancement features) configured to transfer heat as a boiling surface in the heating section of the boiling chamber, preferably made from copper. In another embodiment, enhancement features are present in the boiling chamber to enhance the heat transfer processes in the boiling chamber. These features are applied in one embodiment on the boiling surface or placed in another embodiment in the section configured to contain liquid to enhance at least one of the heat transfer rate and heat transfer coefficient. In an embodiment, a boiling chamber can be configured with bubble diverters such that vapor bubbles generated from boiling in the heating section and liquid-vapor two-phase flow can be directed towards condensing surfaces. In another embodiment, pool boiling performance enhancement features such as microchannels, pin fins, porous structures, microstructures, nanostructures, bubble diverters, and combinations thereof can be applied over the boiling surface in the heating section.

These and other aspects of the present disclosure will become apparent upon a review of the following detailed description and the claims appended thereto.

BRIEF DESCRIPTION OF THE DRAWINGS

FIGS. 13A-13E each show a different pool boiling enhancement feature over the boiling surface in the boiling chamber; and FIG. 14A shows thermal communication between the external heat source and the boiling chamber, FIG. 14B is an inset showing a configuration of the heating section with the external heating source in contact with a boiling surface of the wall of the boiling chamber, and FIG. 14C is an inset showing another configuration of the heating section with the external heating source as the boiling surface.

DETAILED DESCRIPTION

Figure 1:
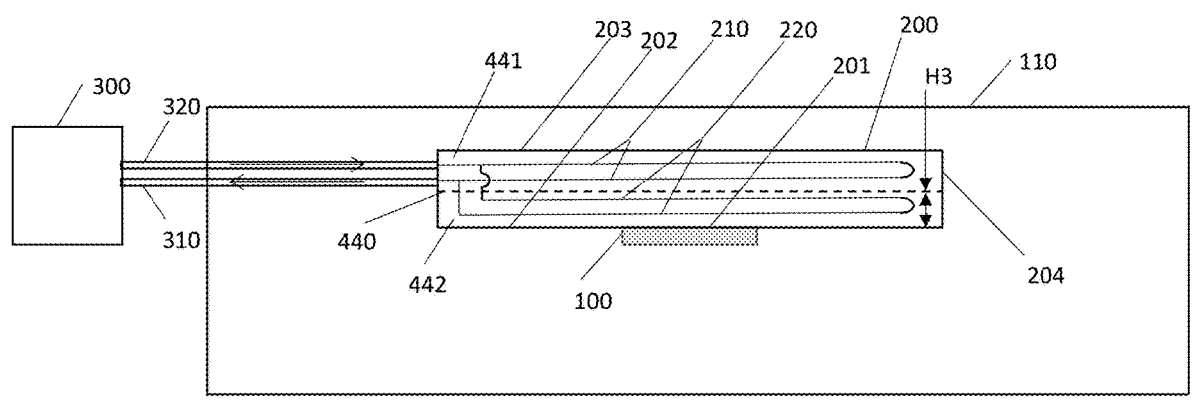
FIG. 1 shows an embodiment of a device for cooling a CPU of a computer in accordance with the present disclosure.

Some of the terms associated with boiling and condensation processes are defined here. Saturation temperature refers to the temperature at which a liquid is in equilibrium with its vapor across a flat liquid-vapor interface at a given pressure. Boiling refers to a process in which vapor bubbles nucleate at a solid surface upon heating and depart in the bulk liquid in which the solid surface is submerged. Saturated boiling refers to the boiling process with the liquid at its saturation temperature. A liquid is subcooled when its temperature is below the saturation temperature corresponding to the pressure of the vapor it has an interface with. When a bubble travels through the liquid, it will condense if the liquid temperature at the liquid-vapor interface is below the saturation temperature of the vapor in the bubble. Subcooled boiling refers to the boiling of a liquid that is subcooled. Condensation refers to the change of phase from vapor to liquid and is accompanied with removal of heat from the condensing vapor. Condensation is generally accomplished by bringing a vapor in contact with a solid surface that is cooled below the saturation temperature. Submerged condensation refers to the condensation of vapor in the subcooled liquid. Bulk liquid refers to the liquid in the boiling chamber that is representative of the state of the liquid in the chamber. Subcooling refers to the temperature of the bulk liquid being lower than the saturation temperature corresponding to the pressure in the boiling chamber. The degree of subcooling refers to the temperature between the saturation temperature and the temperature of the bulk liquid in the boiling chamber. Bubbles generated from heating a pool of liquid rise through the liquid. If the liquid is subcooled, the vapor in the bubble condenses in the liquid, and submerged condensation occurs. Submerged condensation is a very effective heat transfer process for condensing vapor bubbles and removing heat using a volume of liquid that is cooled by the cooling cools. When the bubbles are generated in a flow stream of liquid that is subcooled, bubbles are carried away with the flow, and submerged condensation occurs in the stream. If the vapor bubbles in pool boiling encounter a liquid region that is subcooled, submerged condensation occurs. If the vapor bubbles in flow boiling encounter a liquid region that is subcooled, submerged condensation occurs. In a typical pool boiling system under the influence of gravity, the boiling surface of the heater section is oriented horizontally, and the heat transfer occurs from bottom to top. As the surface gets superheated, vapor bubbles nucleate from the cavities on the surface, detach and rise vertically due to buoyancy force while the working fluid rewets the boiling surface from other directions. The direction of these bubbles can be manipulated to reach cooling coils efficiently using bubble diverters. The geometry of a bubble diverter can be changed according to the orientation of the cooling surfaces in the boiling environment. A vapor chamber is an enclosure in which the evaporation occurs over the heating surface and the enclosure is filled with vapor which condenses in the same enclosure without vapor being transported to another location such an in a thermosiphon loop or a heat pipe.

A boiling chamber is defined in this disclosure as a chamber in which boiling occurs in a pool of liquid and condensation occurs in the same chamber; the chamber also encloses cooling surfaces of cooling elements, which are also referred to as cooling coils, condensing coils, condensing surfaces and cooling surfaces, that are cooled by an external cooling medium and remove the heat from the condensation process of the bubbles generated during the boiling process mainly through submerged condensation. The cooling surfaces also subcool the boiling liquid. Boiling liquid refers to the liquid that is used inside the boiling chamber. The cooling medium is circulated through the cooling elements which present heat transfer surfaces that remove heat from the boiling chamber. The cooling medium is connected to an external cooling source to remove heat from the cooling medium. The cooling medium is recirculated through the external cooling source to the cooling medium in the boiling chamber, effectively transferring heat from the boiling chamber to the external cooling source. In an embodiment, the external cooling source is a part of a secondary cooling loop that interfaces with a second external cooling source, such as a cooling tower, cooling ponds, atmospheric air, and the like.

A cooling device is disclosed as having a boiling chamber, including a thermally conductive boiling chamber having a section configured to contain liquid, a section configured to contain vapor in contact with the section configured to contain liquid, a heating section in communication with an external heat source and the section configured to contain liquid; and a cooling element configured to communicate with an external cooling source and disposed in at least the section configured to contain liquid, wherein when liquid is present in the section configured to contain liquid and heated by the heating section resulting in boiling and vapor generation resulting in the formation of bubbles within the liquid, heat is exchanged (a) between the liquid and the cooling element and (b) between the liquid and the bubbles resulting in submerged condensation, such that the heat transfer rate in the heating section is at least 50 Watts. In an embodiment, the bubbles condense directly on the at least partially submerged cooling element. In an embodiment, the fraction of the surface area of the at least partially submerged cooling element exchanging heat with liquid in the boiling chamber is in a range of from 10% to 100% of the total surface area of the cooling element in the boiling chamber. In an embodiment, the fraction of the surface area of the at least partially submerged cooling element exchanging heat with liquid in the boiling chamber is in a range of from 5% to 100% of the total surface area of the cooling element in the boiling chamber.

A thermally conductive sealed boiling chamber is configured to remove heat from an external heat source, such as a CPU. A boiling surface generates bubbles in the liquid resulting from heat transfer in the heating section. In an embodiment, this can be accomplished by bringing the surface of the heat source in contact with a wall or walls of the boiling chamber. In an embodiment, this can be accomplished by the surface of the heat source forming a portion of the wall of the boiling chamber. Different embodiments of communication between the external heat source and heating section can be configured to transfer heat from the heat source to the liquid in the liquid-containing section. These embodiments include direct contact of a part of the liquid-containing region with the surface of the heat source, contact of a region of the boiling chamber wall with the surface of the heat source, and/or contact of a region of the boiling chamber wall with a surface of an intermediate element that is in thermal communication with the heat source. In an embodiment of the contact of the two wall surfaces across which heat is transferred, some method of reducing the thermal resistance between the two surfaces is introduced. Thermal pastes, solders and mechanical couplings are some of the examples to reduce the interfacial thermal resistance. In the case of a CPU, the casing may form the wall through which heat generating at the electronic junctions is transferred to the boiling chamber. A heat generating source is defined as supplying heat to the boiling liquid in the boiling chamber. Suitable heat generating sources include cold plates, Integrated Circuit junctions, resistors, laser diodes and other devices that utilize electric energy to accomplish some desired function including computing, laser beam generation, power transistors and other electronic device functions. In an embodiment, the wall of the boiling chamber in contact with the surface of the heat generating source, transfers heat across the wall to the liquid-containing section of the boiling chamber. The wall of the boiling chamber in contact with the external heat source causes a heat spreading effect that depends on the thermal conductivity of the wall and its thickness. In an embodiment, a heat spreader is introduced between the surface of the heat source and the boiling chamber to accomplish this heat spreading effect. The heat spreader is a part of the surface of the heat source in an embodiment. The heat spreader is a part of the boiling chamber wall in an embodiment. The heat spreader is a part of an element that is in thermal communication with the heat source and the boiling chamber in an embodiment. The thermal resistance between the heat spreader and the contacting surface of a wall is designed to be low. During operation, liquid in the liquid containing section receives heat from the heat source. This heat initiates boiling in the liquid over the boiling surface which receives heat from the heat generating source.

The cooling element is configured to remove heat from the boiling chamber. The cooling element is configured to be at least partially submerged in the liquid-containing section. In operation, the cooling element cools the liquid and makes it subcooled. The cooling element contacts the vapor and condenses it. The subcooled liquid contacts the vapor and condenses it. Vapor exists in the bubbles, plume of bubbles, coalesced bubbles, and in the vapor containing section. Boiling in the heating section of the boiling chamber produces bubbles that contain vapor. Vapor contacts liquid in the liquid-containing section. Subcooled liquid in the liquid-containing section causes submerged condensation. This process refers to vapor contacting subcooled liquid and condensing. It can also include vapor directly condensing on the part of the cooling element that is submerged in the liquid. It can also include some vapor directly condensing on the part of the cooling element in the vapor containing section of the boiling chamber.

Subcooling the liquid causes the vapor to undergo a submerged condensation process. Subcooling also causes a subcooled boiling process when the subcooled liquid contacts the boiling surface. The subcooled boiling process is advantageous from a heat transfer perspective. It improves the boiling process. The vapor bubbles become smaller and undergo condensation as they are growing. In an embodiment the liquid over the boiling surface is at a saturated condition. The liquid over the boiling surface in an embodiment is superheated from the heat transfer from the boiling surface to the liquid. The bubbles condense in the subcooled liquid after departure from the boiling surface. The combination of submerged condensation and subcooled boiling is another unique feature of the disclosure. The disclosure includes a configuration where the boiling occurs at saturated conditions and the vapor is condensed under submerged condensation. This disclosure enables the heat removal device to be compact and be accommodated in small spaces. One example is the cooling of 1-U and 2-U servers. In this application, the space above the CPU placed in a horizontal orientation is typically on the order of 25 mm. The boiling chamber is configured to meet this space constraint. In a 2-U server, the space above the CPU is larger in comparison to the 1-U server and the boiling chamber can be easily accommodated. Other embodiments of the boiling chamber are designed to meet other space constraints such as a 10 mm space, 15 mm space, 30 mm space, 40 mm space, 50 mm space, 60 mm space, and 70 mm space above the CPU. In some embodiments, the space is between these values listed.

Since the highly efficient boiling and condensation processes are employed without additional resistances, such as wick transport in the case of capillary transport heat pipes, the thermal resistance offered by the boiling chamber is very low. It compares with the best options available, while the heat flux and total heat dissipation limits are significantly higher since individual boiling and condensation processes have been extensively researched and surfaces and techniques are available to this end. The highest heat flux dissipation in pool boiling is in an excess of 400 W/cm$^2$ with a boiling structure height of less than 1 mm on the boiling surface. Condensation is also a very efficient process. Condensation surface area is a major consideration. By providing more condensation area in the boiling chamber, the performance of the condenser and consequently, that of the boiling chamber is improved. In space-constrained configurations, in traditional vapor chambers, low liquid heights can be employed without submerged condensation. Low liquid heights cause two problems. Although the heat transfer coefficient is higher with low liquid heights as compared to large heights that is three times the departure bubble diameter, the critical heat flux is lower due to liquid being unable to wet under low liquid height conditions. Here, the low liquid height refers to liquid height below three times the departure bubble diameter under pool boiling at the boiling chamber pressure. Providing submerged condensation permits larger liquid heights in the boiling chamber, larger space availability for the cooling medium that takes heat away from the boiling chamber through the condensing coil, and improved boiling performance under subcooled boiling condensation. The condensing coil also acts as the subcooling coil. Condensing coils serve as the condensing as well as the subcooling coils that are cooled by the cooling medium. Liquid height, surface area offered by the cooling medium, and condenser and boiling surface enhancement features are some important considerations in the design of the boiling chamber.

The heat removal is expressed in terms of the heat flux and heat transfer rate. The surface temperature of the boiling surface is also an important consideration as it is kept below a certain value depending on the application. In terms of the boiling performance, the heat flux provides an important measure based on the heat source surface area contacting the boiling chamber, either its walls or the liquid containing portion in case of direct boiling on the CPU surface. This surface is referred to as the casing surface in an embodiment. Similar temperature measures are used in other applications that provide guidance to the maximum allowable temperature in a boiling chamber. The junction temperature of an IC circuit in the electronic device is another temperature measure. A heat flux of above 20 $W/cm^2$ on the surface area of the heat generating source in communication with the boiling chamber is of commercial interest, and the boiling chamber can deliver this cooling performance. Other heat fluxes that the boiling chamber can deliver are 30 $W/cm^2$, 40 $W/cm^2$, 50 $W/cm^2$, 60 $W/cm^2$, 80 $W/cm^2$, 100 $W/cm^2$, 120 $W/cm^2$, 150 $W/cm^2$, 175 $W/cm^2$, 200 $W/cm^2$, 250 $W/cm^2$, 300 $W/cm^2$, 350 $W/cm^2$, 400 $W/cm^2$, 500 $W/cm^2$, 750 $W/cm^2$ or 1000 $W/cm^2$. The heat transferred in terms of the heat transfer rate depends on the heat flux and the surface area of the heat generating source in communication with the boiling chamber. The boiling chamber can deliver a heat transfer rate of 10 W, 20 W, 40 W, 50 W, 75 W, 100 W, 125 W, 150 W, 175 W, 200 W, 250 W, 300 W, 350 W, 400 W, 500 W, 600 W, 700 W, 800 W, 90 W, 1 kW, 1.25 kW, 1.5 kW, 1.8 kW, 2 kW, 2.5 kW, 3 kW, 5 kW or 10 kW. The boiling chamber can be scaled up from 1 to 100 times with similar increases in the heat removal rates. In an embodiment, the external heat source dissipates heat in a range from 50 W to 4000 W in the boiling chamber. In another embodiment, the external heat source dissipates heat in a range from 50 W to 10 kW in the boiling chamber.

A boiling process is disclosed for high heat flux cooling, including heating with an external heat source liquid in a liquid-containing section of a thermally conductive sealed boiling chamber partially filled with liquid; and cooling with an external cooling source that is communication with a cooling element at least partially submerged in the liquid within the boiling chamber, wherein the liquid is heated causing boiling and vapor generation resulting in the formation of vapor bubbles within the liquid and heat is exchanged (a) between the liquid and the cooling element and (b) between the liquid and the vapor bubbles resulting in submerged condensation, such that the heat transfer rate to the boiling chamber is at least 50 Watts. This process can deliver heat fluxes and heat transfer rates discussed above with respect to the boiling chamber. In an embodiment, the height of the liquid in the partially filled boiling chamber is in a range of from 2 mm to 100 mm. The liquid may be subcooled such that the nucleating bubbles condense on the heater surface before departing because of the subcooling of the liquid. One embodiment includes interfacing the external cooling source with a second external cooling source as part of a secondary cooling loop.

The present disclosure introduces a concept of a cooling device having a boiling chamber. A boiling chamber removes heat by boiling a pool of liquid and condensing the resulting vapor inside the chamber using condensation processes, including a submerged condensation process. More particularly, a heat source, such as a CPU, electronic device, or a cold plate mounted with heat generating devices, heats the liquid in the liquid-containing section of the boiling chamber. Heat flows through the boiling chamber and is transferred to the liquid inside the boiling chamber. The boiling chamber is sealed and filled partially with the boiling liquid. Non-condensable gases are removed from the boiling chamber prior to charging it with liquid. The space above the liquid in the boiling chamber is occupied by its vapor. The pool of boiling liquid and its vapor are cooled by cooling surfaces of one or more cooling elements at least partially submerged in the boiling liquid. The cooling elements are cooled from the internal circulation of an externally supplied cooling medium. Vapor resulting from the boiling process is at least partially condensed in the liquid and by portions of the cooling elements submerged in the boiling liquid. Cooling elements may also be present in or extend into the vapor space above the liquid such that the vapor rising through the liquid condenses on them. This provides efficient utilization of the volume of the boiling chamber and increases the heat removal capacity within a given space by employing subcooled pool boiling, submerged condensation and direct vapor condensation on the cooling elements. In a system filled with liquid, it is preferred to have at least some vapor space such as in the vapor section to avoid pressure buildup from liquid expansion. Boiling in the vapor chamber may be subcooled boiling or saturated boiling depending on the local temperature of liquid. Another embodiment provides subcooling the boiling liquid with a cooling element to a temperature below the saturation temperature corresponding to the pressure in the boiling chamber and causing subcooled boiling on a boiling surface in the boiling chamber. The actual distance of the liquid where the temperature is relevant depends on the bubble size as the subcooling makes the nucleating bubbles condense and reduce their growth rate. It is desirable to maintain the heated liquid closer to the saturation temperature as the bubbles will grow rapidly and cause liquid motion. At high heat fluxes above the heat flux at the beginning of the boiling process, it may be useful to subcool liquid being recirculated over the boiling surface. Other considerations, such as a higher CHF may dictate the subcooling which benefits by raising the CHF value in an embodiment. Further, the disclosure enables dissipation of high heat fluxes in the range higher than 10 $W/cm^2$ to over 1000 $W/cm^2$ depending on the boiling liquid from the heat source in a limited height in which the cooling device, such as the present boiling chamber, can be mounted. Higher heat fluxes up to 2000 W/cm² may be possible by employing ultra-high boiling enhancement features. Lower range is attained for dielectric fluids or refrigerants, and higher range is achieved with water as the boiling liquid. For example, it is possible to dissipate up to 100 W/cm² and even higher heat fluxes from a CPU of an area of 34.5 mm×32 mm with a 1" height limitation over a 1-U server used in the data center application using water as the boiling liquid.

The surfaces of the cooling element remove heat from the boiling liquid and vapor within the boiling chamber, and the cooling capacity may be enhanced by employing heat sinks, heat pipes or heat exchangers. The cooling element is placed inside the boiling chamber volume within the enclosing surfaces of the chamber. The walls of the boiling chamber may also serve as the cooling element. In an embodiment, multiple cooling elements are employed in the boiling chamber. In an embodiment, the closest part of a cooling element to the external heat source is less than 20 mm from a surface of the external heat source. In other embodiments, the closest part of a cooling element to the external heat source is less than 50 mm, less than 30 mm, less than 25 mm, less than 10 mm, less than 5 mm, or less than 2 mm from a surface of the external heat source, respectively.

The cooling elements may be of any cross-section, such as circular, oval, rectangular, square, wedge shaped, expanded pocket type, and other geometrical shapes and may feature enhanced surfaces on one or both sides to enhance heat transfer. In one embodiment, the percentage of the surface area of the at least partially submerged cooling element exchanging heat with the liquid in the boiling chamber is in a range of from 10% to 100% of the total surface area, preferably in a range of 30% to 100%, and further preferably in a range of 30% to 90%, of the cooling element. The heat removed from the submerged portion of the cooling element is in a range of 10% to 100% of the total heat removed from the boiling chamber. These cooling elements provide cooling surfaces inside the boiling chamber. Heat is removed by an external cooling medium, including air, liquid, vapor, gas, and mixtures thereof. The cooling medium may further undergo heat transfer processes to transfer heat to another cooling medium. The cooling medium may be in thermal communication with a heat sink, such as ambient air or a body of water. The cooling of the cooling medium may be accomplished by employing a cooling tower, a refrigerant cooled chiller system, a secondary cooling loop with heat exchangers, atmospheric air, or a body of water such as a pond, lake or ocean. Enhanced surfaces and bubble diverters may be employed on the heat transfer surfaces and in the boiling chamber enclosure to improve the heat transfer performance during single-phase cooling of the boiling liquid, boiling of the boiling liquid, and condensation of vapors of the boiling liquid. Bubble diverters may be added in the boiling chamber to divert the bubbles and the resulting two-phase flow of liquid and vapor towards certain sections of the cooling elements to improve the performance of the cooling elements submerged in the boiling liquid, including submerged condensation and subcooling of the boiling liquid. A portion of the cooling surface area of the cooling element available for subcooling may also be present in which no vapor contacts this portion of the cooling element. This portion serves to generate subcooled liquid. The condensing region of the cooling element may also generate subcooled liquid. Bubble diverters, tapered gaps and liquid flow diverters may be added in the boiling chamber to create a circulation of the boiling liquid over the cooling elements and the boiling surface. The boiling chamber is operated in a gravitational field such that any liquid introduced in the boiling chamber forms a pool of liquid which is being cooled and forms a liquid-vapor interface that separates the liquid and the vapor in the boiling chamber. Bubbles are nucleated in the boiling liquid and flow through the boiling liquid towards the interface and arrive at the vapor space above the liquid. The mode of heat transfer from the boiling surface to the boiling liquid depends on the heat flux and the cooling capacity of the condensing coils and liquid circulation patterns in the boiling chamber. The level of subcooling is governed by the cooling element's cooling capacity and inlet temperature which dictates the pressure in the boiling chamber. The resulting two-phase flow of vapor and liquid improves heat transfer to the cooling coils that are partially or completely submerged in the boiling liquid. The surface of the cooling coil that is not submerged in the liquid and is present in the vapor space provides heat transfer surfaces for the vapor phase condensation. To improve the performance of the boiling chamber, features are introduced to reduce the degree of subcooling in the liquid and the heat transfer is improved as the boiling process approaches the saturated boiling conditions in an embodiment. Artificial nucleation sites may be introduced on a boiling surface to initiate boiling to avoid excessive wall superheat during startup and at the onset of the boiling process. This avoids explosive boiling that may occur at the initiation of the boiling process during startup. Macroscale, microscale and nanoscale enhancement features representing feature sizes greater than 1 mm between and including 1 mm to 500 micrometers and smaller than 500 micrometers, respectively may be present on the boiling surface to improve the boiling performance in terms of at least one of the heat transfer coefficient and critical heat flux.

Currently disclosed is a cooling device and processes to remove heat from a heat source and dissipating it to a larger area by using boiling and condensation processes in an enclosure of a boiling chamber that is partially filled with a boiling liquid. It utilizes submerged condensation of vapor, generated by the boiling process, in the boiling liquid that is cooled over a cooling element by an external cooling medium. Direct vapor condensation may also occur over the condensing surfaces of the cooling elements within the vapor space of the boiling chamber. In addition, direct vapor condensation and single-phase cooling of boiling liquid may occur from the surfaces of the walls of the boiling chamber, which may be cooled by an external cooling medium.

Potential applications of the cooling device with the boiling chamber include heat removal from computer chips of a given area and transferring the heat to an external cooling medium such as air, gas, or a liquid. The cooling medium may include an evaporating liquid that removes heat. The disclosure utilizes a boiling process in which vapor bubbles are generated in a liquid and heat is removed from the heat source, and condensation of vapor occurs (i) in the boiling liquid that is cooled by submerged cooling coils, (ii) in the vapor space over the liquid-vapor interface, and (iii) the heat transfer surfaces of the cooling coils in the vapor space within the same enclosure. The nucleating bubbles also create a flow circulation of boiling liquid which is carried over to the surfaces of the submerged cooling coils and is cooled. The circulation aids in the condensation process. The circulation may also aid in subcooling the liquid by the cooling medium. The boiling liquid is subcooled to a temperature below the condensation temperature of vapor bubbles depending on the vapor pressure in the boiling chamber, which is governed by the rate of vapor generation and the rate of condensation within the boiling chamber, and some of the bubbles condense in the subcooled boiling liquid. The external cooling medium enables the condensation of vapor bubbles and cooling of boiling liquid. Among the potential applications, it is applicable to remove heat from electronic devices such as CPUs and other computer chips and devices and cold plates on which heat generating devices may be mounted. This is particularly suitable where there are severe space constraints, such as in cooling of 1-U, 2-U, and other servers in data center applications. Future servers may require a different space constraint which can be handled by designing the boiling chamber to meet those requirements. The minimum height of the liquid in the boiling chamber is in the range of 2 mm to 10 mm, depending on the departure bubble diameter corresponding to the operating pressure and the properties of the boiling liquid. It is preferable to have the liquid height above the heat source in the range of from 2 mm to 60 mm, preferably 2 mm to 30 mm, and more preferably 2 mm to 20 mm. In another embodiment, the liquid height above the heat source is in the range of from 5 mm to 100 mm. It can be applied to cold plate applications which can have integrated boiling chambers. It is also applicable to processes involving evaporation and condensation within an enclosure. Elements of the disclosure can be applied in an individual component design as well as in the overall system design. The disclosure presents new techniques to improve the evaporator efficiency through the circulation of liquid and liquid subcooling. It also presents new techniques to improve condenser efficiency. Together, it presents a technique to improve the overall system efficiency for heat removal.

Some of the features of the disclosure include condensation of vapor inside the boiling chamber using submerged condensation of vapor in the pool of boiling liquid that is cooled by an external medium. Some of the vapor condenses in the boiling liquid that is cooled to provide the subcooling necessary for condensing the vapor. The cooling medium subcools the boiling liquid and causes submerged condensation of vapor. The heat exchanger surface between the cooling medium and the boiling liquid may be fully or at least partially submerged in the boiling liquid that is contained in the boiling chamber enclosure. The vapor may also directly condense on the heat exchanger surfaces that are being cooled by the cooling medium both in the liquid and in the vapor space. Another feature of the disclosure is that it utilizes the volume of the boiling chamber to accommodate the cooling elements, such as cooling coils and increases the cooling surface area significantly above that provided by the enclosure walls in embodiments where the walls of the boiling chamber act as condensers. This causes the boiling process to approach closer to the saturated boiling process, which generates vigorous vapor bubble activity, while condensation occurs in the liquid with greater subcooling to increase the efficiency of the condensation process. Such techniques need careful evaluation as any impediment of liquid flow towards the heater deteriorates the boiling heat transfer performance, especially the critical heat flux.

The boiling chamber is advantageous over a vapor chamber as it is not limited by liquid return considerations through the wick structure that is inefficient as compared to direct liquid return due to liquid circulation in a pool. It eliminates the need for large vertical lengths for the return of the condensed liquid in a thermosiphon loop. Additionally, the boiling chamber does not require a complex wick structure needed for the capillary return of liquid. Utilizing the boiling chamber enables the possibility of using enhanced pool boiling techniques available in the literature.

In an embodiment, the enhancement feature that transforms pool boiling into a pump-less flow boiling configuration is employed. Condensing surfaces can be placed in both liquid and vapor sections, thereby providing a larger surface area of the cooling coils to remove heat from the liquid and vapor in the boiling chamber. Cooling coils with enhancement features to improve heat transfer with the boiling liquid and vapor can be incorporated in the boiling chamber. Fins, porous surfaces, and specially designed surfaces to enhance submerged condensation can be incorporated. These include surfaces that reduce the barrier introduced by the boiling liquid over the condensing surfaces for the condensing vapor. Additional enhancement strategies are expected to be developed for the submerged condensation processes. Both critical heat flux and heat transfer coefficient can be enhanced in the boiling chamber through these techniques while maintaining the temperature of the heat source below a desired limit for a given coolant temperature in the cooling coils. Some of the techniques for enhancing heat transfer on boiling and condensing surfaces include microchannels, tapered gap manifolds, sintering, graphene coatings, porous coatings, finned structures, microgrooves, hybrid structures incorporating hydrophobic and hydrophilic surfaces, structures employing separate liquid-vapor pathway generating element, volcano structures, nucleating regions with feeder microchannels, reentrant cavities, etc.

The boiling chamber is suitable for applications where the space above the heat source is limited. For example, it is very suitable for data center applications for cooling CPU, which has a limitation of 1" space. In other applications, this height limitation is 2", 3", and up to 6". In some applications, the entire computer may be immersed, in which case the vertical dimension of the liquid pool may be as high as the height of the computer or server height. In some other applications, higher height constraints may exist, and considerably higher heat dissipation may be employed. With water as the boiling liquid, the heat flux from the heat source that can be dissipated is up to 100 W/cm$^2$ in some embodiments, and in other embodiments a heat flux of up to 380 W/cm$^2$ can be accomplished. Heat transfer coefficients on the boiling surface could be enhanced to 50,0000 W/m$^2$K with some enhancement features, whereas heat transfer coefficients as high as 600,000 W/m$^2$K and higher can be accomplished. By increasing the capacity of cooling coils to carry higher heat rates, large heat dissipation of over 400 W can be accomplished from a boiling surface of 34.5 mm×32 mm size. In an embodiment, a heat flux of 110 W/cm$^2$ was reached. Increasing the surface area of the cooling surfaces and increasing the heat carrying capacity of the cooling medium, the surface temperature of the heat source can be controlled and held below the allowable limit, such as 80° C. employed in many electronic device cooling applications. Other higher or lower temperature limits may exist in other applications. With dielectric fluids as the boiling liquid, heat fluxes of up to 50 to 100 W/cm$^2$ may be achieved. With enhancement features on a boiling surface, higher heat loads of 600 W to 2000 W can be accomplished over a CPU of about 10 cm$^2$ surface area. With the higher heat flux capabilities through advanced enhanced structures, such as dual taper, graphene coated nano and microstructures, the total heat removed could be significantly higher. A tapered gap may be introduced with a gap height in the range of 100 μm to 5 mm and a taper angle in the range of 1° to 30°. The gap creates a flow of bubbles in the direction of increasing taper. Cooling elements may be located at the exit of the gap at the end of the increasing taper. The condenser could become a limiting factor and therefore, a larger cooling coil is needed for improving the performance. The boiling chamber width and depth can be increased if the height is limited. Proper circulation of boiling liquid can be accomplished by using bubble and flow diverters. Another embodiment comprises directing the vapor generated from the boiling process to flow towards the cooling element by placing at least one diverter within the boiling chamber. By employing heat spreaders over the heat source, the heat removal capacity can be further increased.

The current disclosure uses the boiling process to remove heat from the surfaces from which heat is to be removed. The heat transfer surfaces are submerged in at least 1 mm height of the boiling liquid. In some embodiments, the liquid height is in the range from 1 mm to 100 mm, preferably from 2 mm to 30 mm, or more preferably from 2 mm to 15 mm. Enhanced surfaces may also be employed to improve at least one of the heat transfer coefficient or critical heat flux (CHF) that determines the maximum heat dissipation from a surface under boiling mode without incurring excessive wall superheat. The CHF determines the upper limit beyond which excessive wall superheats are required to transfer heat as in the film boiling mode. Bubble diverters may be employed to direct bubbles and the two-phase flow towards the heat exchanger surfaces that are submerged in the liquid. The motion of the liquid towards the boiling surface can also be modified using diverter structures. The motion of the vapor and liquid over the heat transfer surface improves the heat transfer from the boiling liquid to the cooling medium and causes the boiling liquid to become subcooled. This subcooled liquid causes submerged condensation of vapor generated in the boiling process.

Subcooling of boiling liquid improves the heat transfer performance of the boiling process. This is referred to as subcooled boiling. It can result in a higher critical heat flux as well as higher heat transfer coefficient during the boiling process. The subcooled boiling liquid causes submerged condensation of vapor. The current disclosure combines these two processes of subcooled boiling and submerged condensation simultaneously inside the boiling chamber. In this invention, subcooling the boiling liquid is accomplished with at least a part of the cooling element to a temperature below the saturation temperature corresponding to the pressure in the boiling chamber.

The current disclosure utilizes a cooling device with a sealed boiling chamber in which the boiling and condensation processes occur. Heat exchangers such as cooling elements that are cooled by an external coolant are incorporated inside the boiling chamber. In an embodiment, the walls of the vapor enclosure are also cooled by the external cooling medium to cause condensation and liquid subcooling. In a preferred embodiment, one or multiple cooling elements are introduced inside the boiling chamber for removing heat.

Another feature of the current disclosure is that the heat removal by utilizing boiling and condensation processes is accomplished in the restricted space available for cooling 1-U and 2-U servers employed in a data center. The current boiling chamber can be fitted in the available space over a CPU of such computers and servers. The boiling chamber can be used to cool any heat generating device that requires heat removal from a boiling surface under an area constraint or space constraint. This is accomplished by providing heat exchangers such as cooling elements of different designs, including compact heat exchanger configurations and other configurations that are submerged in the boiling liquid inside the boiling chamber enclosure. The boiling chamber height can be configured to fit in a specified space, and the cooling element can be accommodated by increasing the width and depth of the boiling chamber. The use of diverters can circulate the boiling fluid towards condensing surfaces to accomplish the submerged condensation. One embodiment comprises diverting the vapor and creating motion of the liquid over the cooling element by placing at least one diverter within the boiling chamber.

The high performance of this cooling device with a boiling chamber allows the dissipation of large quantities of heat from the heat generating sources. Since the boiling chamber is sealed, refrigerant, dielectric fluid, water, or any other desired working fluid can be used to provide the desired heat dissipation performance. Another advantage of the boiling chamber is that the amount of the working fluid is small. This factor may improve the acceptability of fluids such as water, ethanol, ammonia, and other fluids, which may cause some concern from a safety standpoint. The cost of the working fluid is also small as compared to the thermosiphon loop. In one embodiment, water is used as the liquid in the boiling chamber. In another embodiment, a dielectric fluid is used as the boiling liquid. Water will provide very high performance due to its better heat transfer characteristics, such as high thermal conductivity, and high latent heat. In cases where dielectric fluid is desired, in an embodiment, the boiling chamber can remove heat from 10 to 100 $W/cm^2$ or more from a CPU surface by employing enhancement features such as tapered gap manifold over the boiling surface, microchannels, pin fins, porous structures, microstructures, nanostructures, bubble diverters, and combinations of these and other enhancement features. Additives such as nanoparticles, beads, or other such particles may be added to the boiling liquid to improve the heat transfer performance. Pure or mixtures of liquids can be selected for the working fluid depending on their thermodynamic and thermophysical properties. In addition, additives may be added to prevent corrosion, improve stability and safety, reduce explosion hazards and other considerations.

In an embodiment, the cooling device with the boiling chamber removes 600 W of heat from a CPU that is 30 mm×30 mm using dielectric fluid and a microchannel surface with 400 µm width and depth and a fin thickness of 200 µm.

In the present disclosure, the heat transfer surface over which boiling occurs is submerged with liquid and bubbles are formed over the surface. The boiling surface may be placed horizontally or at any other angle to horizontal, including vertical. Upward facing boiling surfaces are preferred. Downward facing surfaces may be employed with a considerably reduced performance. The cooling element in such cases may be employed close to the heating surface such that the nucleating bubbles can contact the cooling elements while still being attached to heating surface. Enhanced surfaces may be employed to improve the heat transfer performance. In systems employing evaporation from porous structures, some boiling may also occur within the pore structure. The present disclosure utilizes heat transfer surfaces which are submerged under the boiling liquid and bubbles are formed and rise through the liquid. The cooling medium is circulated to present heat transfer surfaces that are also submerged in the boiling liquid. The boiling liquid becomes subcooled by transferring heat to the cooling liquid and bubbles flowing in the subcooled liquid are condensed. The bubbles may also contact the heat transfer surface while still submerged in the boiling liquid and direct condensation may occur. Condensation of bubbles may occur in the submerged liquid and over the heat transfer surface. A heat exchanger may provide both submerged condensation and direct vapor condensation by having part of the heat exchanger surface immersed in the liquid and a part in the vapor space above the liquid level. The cooling liquid may also remove heat from the heat exchanger surfaces which are placed in the vapor space above the boiling liquid. Some subcooling may also occur in these condensers as the condensed liquid remains on the cooling coil surfaces before it is removed. This causes direct condensation of vapor on the heat transfer surface. The condensed liquid falls back into the pool of boiling liquid. Heat exchanger surfaces cooled by an external cooling medium for removing heat from the boiling liquid may be partially or completely submerged in the boiling liquid. Heat exchanger surfaces cooled by an external cooling medium for direct vapor condensation are placed above the level of the boiling liquid in the boiling chamber enclosure. The boiling action may cause the liquid to be carried over the condensing surfaces. In an embodiment, at least 10% of the cooling element is submerged in the boiling liquid. In another embodiment, it is at least 20%, while in a preferred embodiment, it may range from 20% to 100%. The submerged portion is determined in the same geometry configuration of the boiling chamber but under steady conditions while no heat is supplied to the boiling chamber. When the submerged portion is 100% of the total area of the cooling element, vapor in the vapor space above the liquid may condense on top of the boiling liquid at the liquid-vapor interface. The splashing action of the rising bubbles provides the additional interfacial area between the subcooled boiling liquid and the vapor.

The heat transfer surface over which boiling occurs may include enhancement features including, but not limited to, microchannels, grooves, fins, microgrooves, pin fins, porous surfaces, porous structures, microstructures, nanostructures, graphene or GO coated surfaces and combinations of these as well as other enhancement features. Specific features may be incorporated to direct the bubbles in a specific direction away from the boiling surface. The bubbles may be directed towards the heat transfer surfaces being cooled by the external medium. A tapered gap on a plain surface or tapered gap on an enhanced surface such as a microchannel may be incorporated to create a pump-less motion of liquid and two-phase flow over the boiling surface.

Some of the enclosure surfaces of the cooling device may also participate in the heat removal process from the liquid and vapor. The walls of the boiling chamber may also participate in conducting heat away from the heat source, acting as a heat spreader. The boiling chamber may be made of metal, plastic, fiberglass, laminate, or any material that is able to contain the liquid and vapor within the boiling chamber and withstand the pressure, vacuum, temperature, and any other requirements from the specific application including, but not limited to, electrical and magnetic properties, within the boiling chamber.

The CPU generates heat which needs to be removed and it needs to be kept cool below a certain prescribed temperature, such as 80° C., in one case. These CPUs are used in servers in data center applications. These servers contain components that are placed in a compact configuration and have 1-U, 2-U or similar height constrictions. The height of the boiling chamber that is mounted above a CPU is limited. In one exemplary unit, it is 1 inch or 25 mm. The boiling chamber needs to be designed to meet this height constraint. The liquid height is higher in another example and is in the range of 2 mm to 100 mm. This height is selected based on the available space in a particular system requiring heat dissipation, including but not limited to 1-U or 2-U servers or any other device configuration. Other suitable electronic devices include laser diodes, muon beams, and the like.

The boiling chamber provides several advantages over a thermosiphon loop in which vapor resulting from the boiling process is transported to a condenser located at a higher elevation in a gravity field to facilitate the return of liquid from the condenser to the evaporator region where boiling takes place over the boiling surface. Integration of thermosiphon in data center cooling is complex due to condenser height restrictions, liquid and vapor flow balance in units utilizing a single condenser to serve multiple boiling chambers, which are also called as evaporators, proper balancing of the system, interaction between two evaporators, and vulnerability to multiple CPU failures when there is a leak in the thermosiphon loop. The current boiling chamber can be coupled to the external cooling medium loop through sealed lines and the cooling elements in different servers may be connected to common coolant supply and return lines through quick connects. Maintenance and repairs to the electronic components and the cooling system can be accomplished on individual units without affecting other units through coolant isolation valves.

Although the system described in this disclosure describes the cooling of a CPU in a computer, this innovation is applicable to any system where high heat flux removal is desired within a given height or space constraint.

The boiling liquid can be water, refrigerant, dielectric fluid, any fluid, or fluid mixture that undergoes liquid-vapor transformation in the range of temperatures that are applicable between the desired temperature of the boiling surface and the available temperature of the coolant. The choice of liquid is also governed by the requirements of specific applications such as fire hazard, dielectric nature, and the like.

In an embodiment, a bubble diverter is placed over the boiling surface to create a tapered gap in which nucleating bubbles grow and flow preferentially in the direction of increasing taper. Such diverters could be placed individually or together over the boiling surface to provide the flow of liquid and vapor through the narrow gap, essentially transforming a pool boiling system into a flow boiling system. The bubble diverters are placed such that they create liquid flow towards the heating section by placing at least one diverter within the boiling chamber. The cooling elements can be placed such that the bubbles can flow over them and condense, while liquid can also flow over the cooling elements and cool down to provide liquid subcooling. Cooling of the liquid also enables submerged condensation of vapor in the pool of the boiling liquid.

Water, water with additives to prevent freezing, water with additives to reduce fouling, water with additives to reduce oxidation of parts, and water with any other additive can be employed as the secondary cooling medium. In an embodiment, it can be cooled in a central heat exchanger with cooling water from cooling towers or in a refrigeration system and supplied to different boiling chambers. In another embodiment, water may be replaced with another working fluid, including dielectric fluids, refrigerants, other pure liquids and mixtures, and additives may be added to improve the overall system performance, stability, and safety.

In another embodiment, a secondary heat exchanger loop employing a dielectric fluid may be used in the cooling elements of the boiling chamber. The secondary heat exchangers are cooled with water. In this embodiment, water is not introduced in the boiling chamber and the possibility of any water leak is avoided. The secondary heat exchanger in another embodiment is air cooled. In another embodiment, a refrigerant evaporator is used to cool the boiling liquid.

Any combination of air cooling or water cooling of the external cooling medium in the boiling chamber may be employed. In cold regions, free cooling provided by atmospheric air may be employed to remove heat from the external cooling medium used in the boiling chamber. In another embodiment, free cooling is employed to cool the secondary cooling medium.

FIG. 1 shows the details of an exemplary unit for cooling a CPU 100 of a computer in a casing 110. In the present illustration, the computer in a casing is shown to be a 1-U unit server, although it could be any device with a heat-generating source such as the CPU. 201 is the boiling surface. The thermally conductive boiling chamber, referred to boiling chamber 200 is a space enclosed by a bottom wall 202, top wall 203 and side walls 204. The height of the enclosed space within the cooling chamber above a boiling surface 201 in the heating section can be in the range of 10 mm to 30 mm. Boiling chamber 200 is placed in contact with a CPU 100 in the heating section 101 for the boiling chamber. The boiling chamber is filled with boiling liquid and its vapor and requires the removal of air or other non-condensable gases for efficient heat operation of the boiling chamber. These non-condensable gases can adversely affect the heat transfer processes, especially the condensation process. The boiling chamber may be of any cross-sectional shape and size and provides an enclosure for liquid and vapor contained in it. The bottom wall 202 of the enclosure is adjacent to the boiling surface 201 of the heating section 101. The bottom wall 202 may be made of any material such as metal or plastic, preferably metal, and may act as a heat spreader that spreads and removes heat from the boiling surface. The boiling chamber is partially filled with a boiling liquid such that it forms a liquid section 442 separated from a vapor section 441 by vapor-liquid interface 440. Liquid occupies the lower region of the boiling chamber by virtue of gravity and contacts the boiling surface 201, that receives heat from the CPU 100 by conduction through the walls of the enclosure. The top wall 203 of the enclosure may be made of any material including metal or plastic and may remove heat from the boiling chamber to the external medium such as outside air or a heat sink placed on top of it. The side walls 204 contain the vapor space and provide the enclosure volume. One or all the side walls and other non-boiling wall surfaces may also remove heat and may have heat sinks attached to them. Additionally, there may be connections to the boiling chamber for creating a vacuum, charging working fluid, which is the boiling liquid, pressure monitoring, temperature monitoring, additional coolant connections and other functions necessary to support the working of the boiling chamber. Two cooling coils, 210 and 220 are the coolant circulation coils that remove heat from the condensing vapor in the boiling chamber are placed in the boiling chamber. Each coil is connected to coolant supply and return lines of the coolant processing unit 300. The coolant processing unit 300 is connected to the coolant coils through inlet 310 and outlet 320 line. Coolant is supplied through a pumping system to each coil and receives heat from the vapor and liquid in the chamber. Although two coils are shown, there could be one or multiple coils which may be connected in any series and parallel configuration. The coolant processing unit handles the coolant, which may be liquid, gas, air, a mixture of liquid and vapor undergoing single-phase or two-phase heat transfer process within the cooling coils. The coolant processing unit 300 may include heat exchangers, fans, pumps, reservoirs, and other components necessary to provide coolant to the boiling chamber and receive the return coolant from the cooling coils. The coolant processing unit may be connected to other external systems for supplying or removing the coolant or a secondary cooling fluid to remove heat to another location. The cooling coils may come in direct contact with boiling liquid, vapor, or mixtures thereof. Heat received from the heat source such as a CPU, causes the boiling liquid to boil and generate vapor bubbles. These bubbles flow through the liquid when the liquid height H3, which is the vertical distance between the boiling surface 201 and the liquid level in the boiling chamber. The liquid level indicates the interface between the liquid and vapor in the boiling chamber. The preferable range of liquid height H3 in an embodiment is in the range of 2 mm to 30 mm.

The liquid height in the boiling chamber in an embodiment is to be at least the size of a departure bubble diameter. For water at atmospheric pressure, a liquid height of 2 mm is suggested to prevent the boiling surface from drying out. Care should be taken to avoid dryout if lower heights are employed. The cooling coils 210 and 220 interact with the vapor and condense it by removing it latent heat. When the coils contact the boiling liquid, the boiling liquid is cooled and may become subcooled. Subcooling the liquid enables higher heat dissipation rates for a given surface temperature of the boiling surface. By incorporating enhanced boiling surfaces and providing cooling coils for vapor condensation and liquid subcooling inside the boiling chamber, the present innovation results in a highly efficient and compact boiling chamber assembly for cooling CPUs and other high heat flux generating devices. This configuration does not depend on the wick structures or capillary wicking process commonly employed in vapor chambers for liquid return and therefore affords higher heat removal capabilities and improved heat transfer performance taking advantage of the boiling process.

Figure 2:
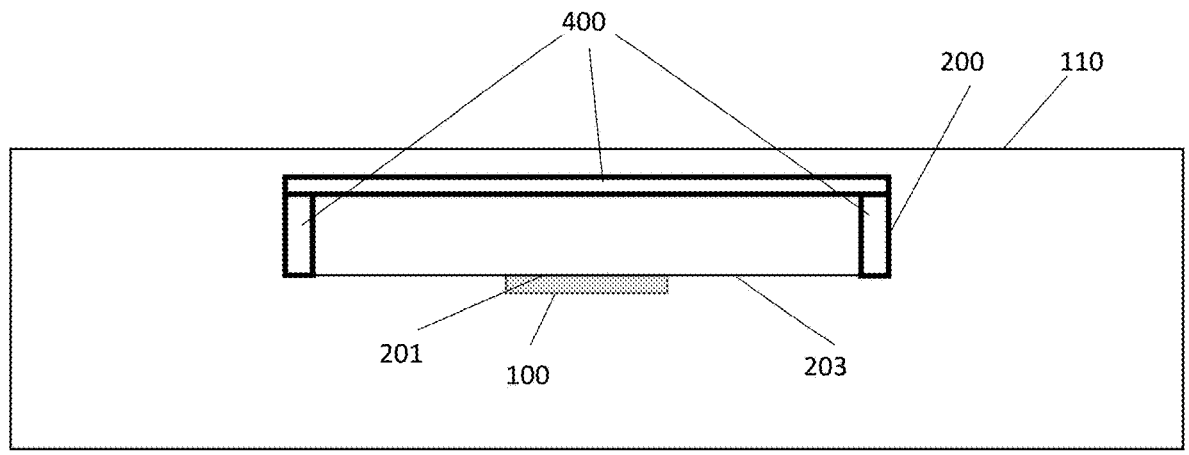
FIG. 2 shows an embodiment of a cooling device having a heat sink mounted thereto.

FIG. 2 shows an embodiment with a heat sink 400 mounted onto the boiling chamber 200 such that it acts as walls of the boiling chamber for cooling a CPU 100 of a computer in a computer casing 110. In the current illustration, heat sink 400 replaces the top wall 203 and side 204 wall while the bottom wall 202 features the boiling surface 201. While it is shown in the present configuration that the heat sink 400 forms multiple walls, the heat sink can replace selective walls too. The heat sink removes heat from the vapor in the boiling chamber and condenses it into liquid which falls back into the pool of boiling liquid. Moreover, the heat sink may cool the liquid such that it can get subcooled. The heat sink may be a cold plate, heat exchanger with natural convection or forced convection, and combinations thereof. This heat sink may be air-cooled, liquid cooled or cooled by a phase change process. Additional features like the connecting line for the coolant in to and out from the heat sink, pump, fan, piping, additional heat exchanger, reservoirs and other supporting elements may also be present but are not shown in this figure.

Figure 3:
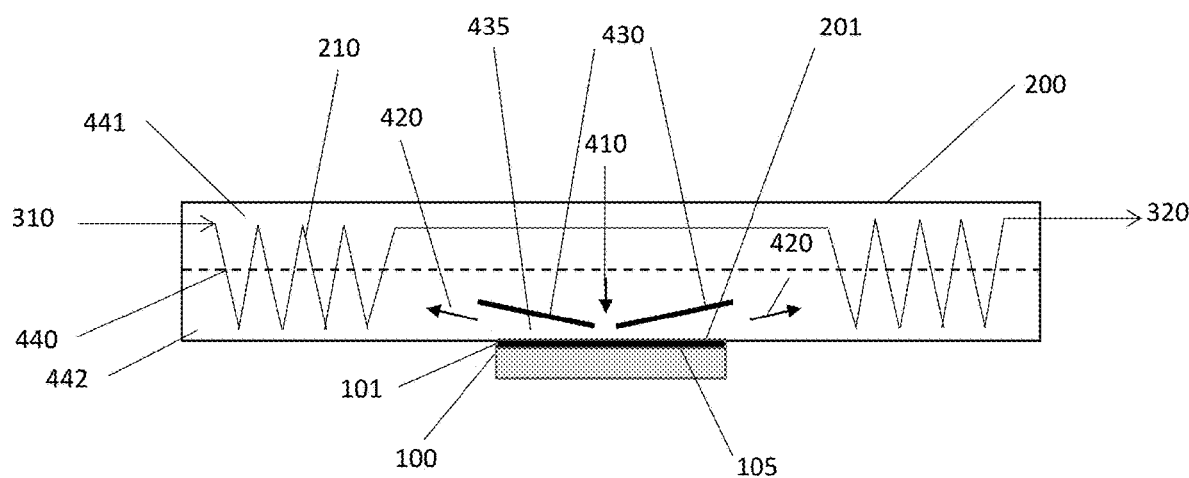
FIG. 3 shows an embodiment of a cooling device having diverters and an external heat source.

FIG. 3 shows an embodiment in which a set of bubble diverters 430 are being used as features for creating taper microgap 435 above the boiling surface 201. The taper microgap 435 is placed such that at least some portion of the microgap remains submerged in the liquid section 442 so that vapor bubbles generated in the liquid over the heater surface are directed in a specific direction to flow towards the cooling coils 210. Another embodiment comprises of at least one diverter within the boiling chamber configured to divert liquid towards the heating section. In an embodiment, at least one diverter within the boiling chamber is configured to divert bubbles and vapor towards the cooling elements. The coolant enters the boiling chamber and the cooling coil from inlet 310 and exits the coil from outlet 320. In the present illustration, liquid section 442 is separated from vapor section 441 by the liquid-vapor interface, 440. The bubble diverter creates a flow of liquid 410 and diverts it onto the boiling surface, and the flow of liquid and vapor as shown by 420. The combined liquid and vapor movement between the diverter and boiling surface gap over the boiling surface may improve the heat transfer performance. The two-phase flow of vapor and liquid could be directed over the cooling coils 210 or 220 shown in FIG. 1 to improve the heat removal from the boiling chamber 200 to the coolant for cooling the external heat source, in this case, a CPU 100. The heating section 101 in FIG. 3 is a region configured with the external heat source or CPU 100 being in contact with the boiling chamber 200 over a contact area 105. The heat flows from the external heat source 100 to the heating section 101 through contact area 105. The boiling surface 201 is the area over which pool boiling takes place in the boiling chamber. The boiling surface can be a plain surface, or with a microchannel, or a surface with additional nucleation cavities, or other types of enhanced surface. The diverters may be attached through a support structure to place them at the desired location above the boiling surface. It may be attached to the cooling coils 210 to provide structural support for the diverters. Additional features like the connecting line for the coolant in to and out from the heat sink, pump, fan, piping, additional heat exchanger, reservoirs, and other supporting elements may also be present but are not shown in this figure.

Figure 4:
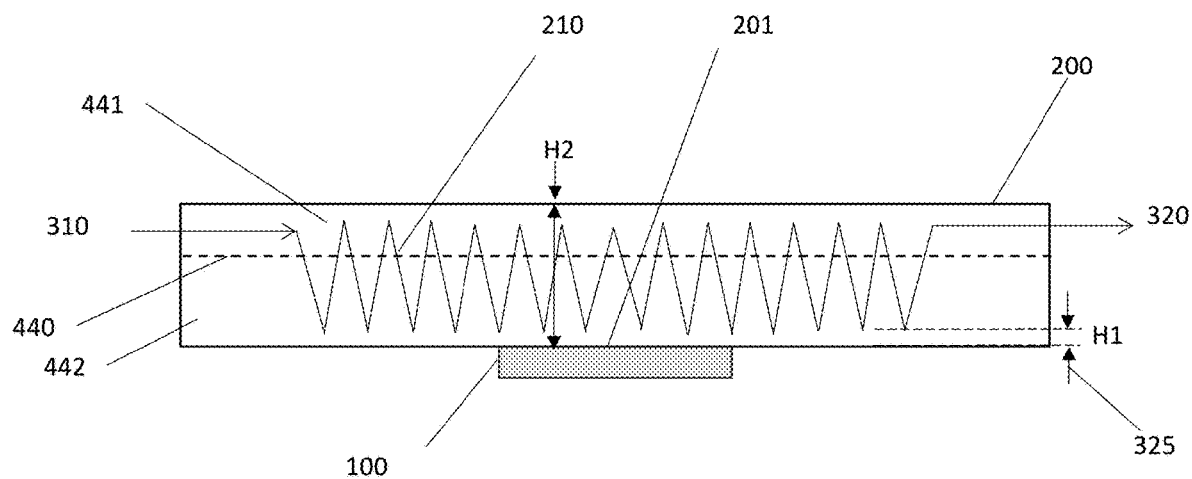
FIG. 4 shows an embodiment of a cooling device having a cooling coil.

FIG. 4 shows the details of an embodiment of the present disclosure in which a cooling coil 210 extends from the vicinity of the lower wall of the boiling chamber 200 that is adjacent to a boiling surface 201 to the upper wall of the boiling chamber that is opposite to the boiling surface. Coolant which is a fluid is pumped from an external chiller to the cooling coil 210 through the inlet 310 and returns back to the chiller from outlet 320. The coil presents cooling surface to the liquid in the boiling chamber, presents condensing surface to the bubbles rising through the liquid, and presents condensing surface to the vapor that is above the liquid level. Boiling liquid partially fills the boiling chamber such that and presents a liquid-vapor interface 440. The liquid-vapor interface 440 divides the vapor section 441 and liquid section 442. The closest part of the cooling element to the boiling surface is at a distance H1 shown as 325 in FIG. 4. In an embodiment, the closest part of the cooling element to the boiling surface is less than 30 mm away. In another embodiment, the closest part of the cooling element to the boiling surface is less than 20 mm away. In yet another embodiment, the closest part of the cooling element to the boiling surface is less than 10 mm away. In another embodiment, a part of the cooling element is in contact with the boiling surface. The height of the enclosed space within the boiling chamber above the boiling surface is in a range of from 10 mm to 30 mm as shown as H2 in FIG. 4. In another embodiment, the height of the enclosed space within the boiling chamber above the boiling surface is in a range of from 5 mm to 50 mm.

Figure 5:
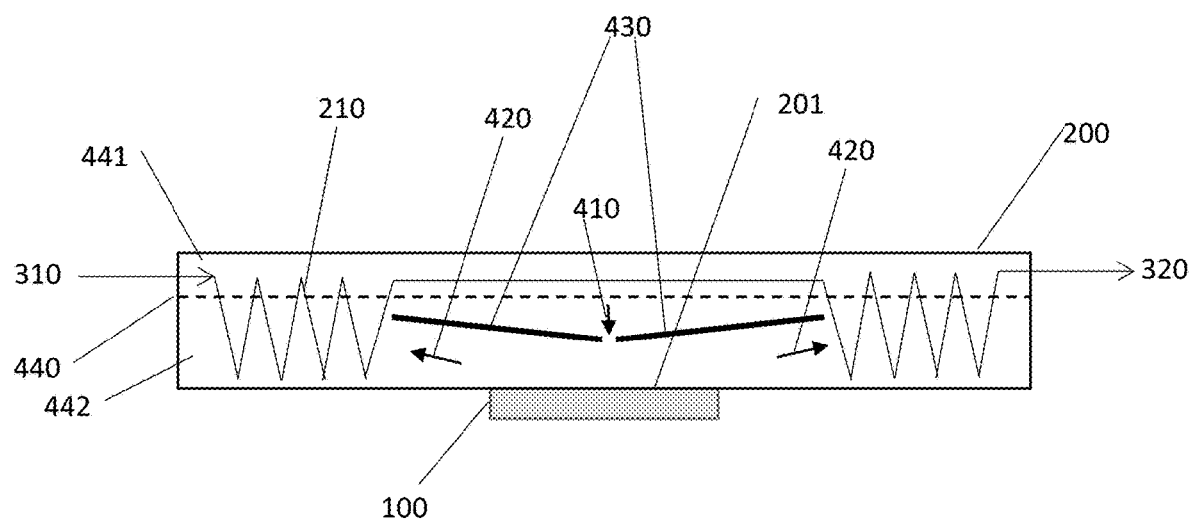
FIG. 5 shows an embodiment of a cooling device having a cooling coil and diverters.

FIG. 5 shows an embodiment with the bubble diverters 430, which are positioned inside the boiling chamber 200 over the boiling surface 201 to direct vapor bubbles towards the cooling coils 210. In the present illustration, the bubble diverters are completely submerged in the liquid section 442, while the condensing coil 210 is partially submerged in the liquid region such that a portion of the coil remains in contact with the vapor section 441. The vapor region and the liquid regions are separated by vapor-liquid interface 440. The bubble diverters promote direct condensation of vapor bubbles in the liquid as they direct bubbles towards the coolant coil surface and the surrounding boiling liquid that is cooled by the cooling coil. The bubble, vapor and liquid diverters may be symmetric, asymmetric, multiple in numbers, flat, curved, with holes, different shapes with gaps between two diverters, or any combinations of these configurations to promote bubble diverter action. The bubble diverters 430 deflect the two-phase flow of vapor and boiling liquid 420 towards the cooling coils. The bubble diverters may direct some of the two-phase flow towards the submerged cooling coils. Cooling coils closer to the top cover in the vapor space provide a condensing surface to the vapor rising above the liquid level. The dual taper is shown in FIG. 5 with 430 as two top covers separated by a gap 410, which brings liquid from the bulk back towards the boiling surface 201. The arrows 420 show the direction in which the bubbles resulting from the boiling process go sideways, drawing liquid through 410. The top covers 430 form a tapered microgap over the boiling surface.

Figure 6:
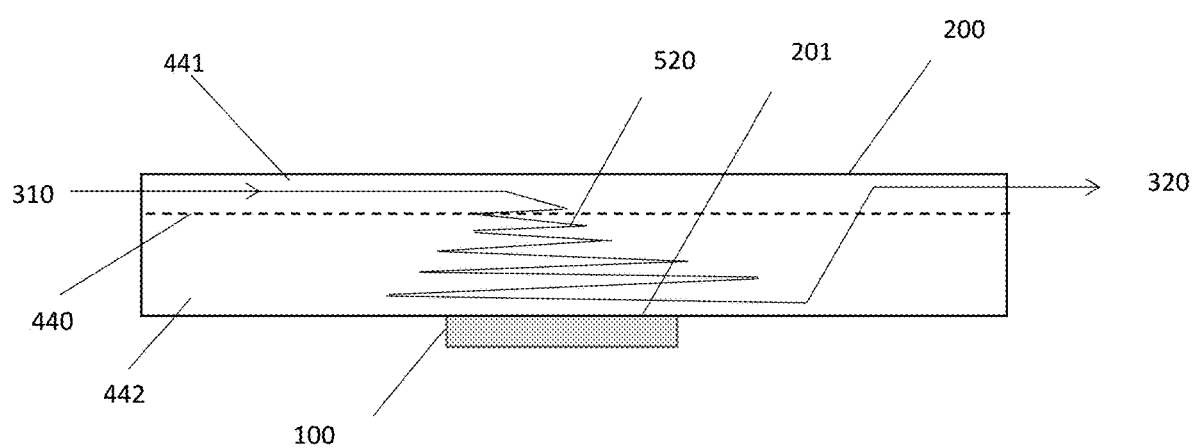
FIG. 6 shows an embodiment of a cooling device having a conical-shaped cooling coil.

FIG. 6 shows an exemplary cooling coil 520 that is wound in a conical or volcano shape and is placed above the boiling surface of the heater section 201 such that it remains partially in the vapor section 441 and partially submerged in the liquid section 442. The coil inlet is connected to the external chiller through inlet 310 and the coil outlet is connected to the chiller by outlet 320. The bubbles rising from the boiling surface through the boiling liquid directly interact with the coil and condense on its surface. The coil also cools the boiling liquid and enables submerged condensation of the vapor in the boiling liquid. The coil may be of any other shape and size, may partially or fully cover the boiling surface and may extend in other regions of the boiling chamber 200. Cooling coils in the boiling chambers may be connected to provide parallel flow or series flow of the coolant through them.

Figure 12:
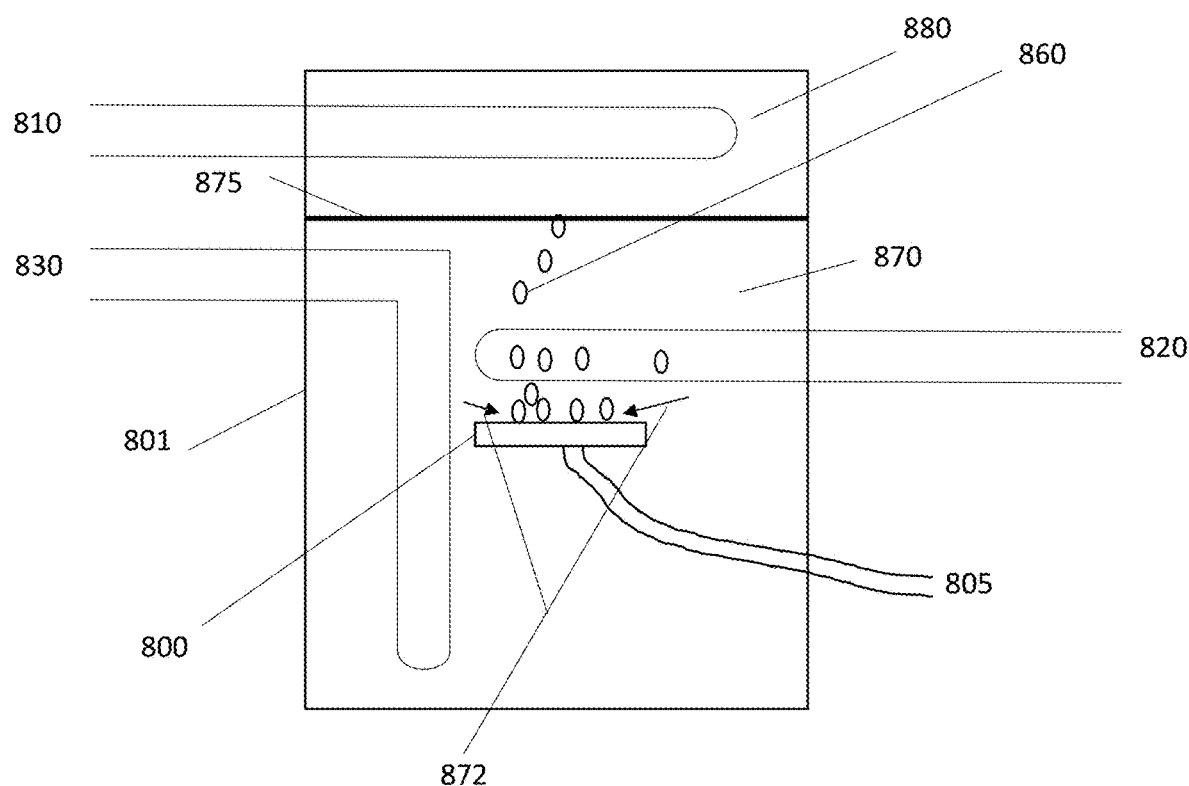
FIG. 12 shows an embodiment of the boiling chamber in accordance with the present disclosure.

A theoretical embodiment of the disclosure of the boiling chamber is shown in FIG. 12. A heat generating device 800, such as a CPU of a computer, cold plate with heat generating devices mounted on them, or any other heat generating object connected to a power source with electrical connections 805 and needs to be cooled is submerged into a liquid 870. In the present illustration, the upper surface of the heat generating device 800 has the heating section which includes the boiling surface that can develop nucleating bubbles. The other external surfaces and walls of these heating generating devices are thermally insulated and do not dissipate heat to the boiling liquid. The liquid section 442 is separated from the vapor section 441 by a vapor-liquid interface 440. This liquid acts as the boiling liquid when it receives heat from the boiling surfaces, such as the surfaces of the device being cooled. The cooling coil for vapor condensation 810, the cooling coil for submerged condensation 820 and the cooling coil for liquid subcooling 830 have inlets and outlets for external coolant in the coolant circulation loop. The cooling coil configuration shown can be implemented in any other boiling chamber embodiment. The cooling coil 810 condenses vapor in the vapor space 880 and returns the condensed liquid to the bath of liquid 870. The liquid returns to the boiling section as shown by the arrows 872. Cooling coil 820 cools the liquid provides submerged condensation of vapor as it is rising in the liquid. Some of the vapor condenses directly on the cooling coil. The cooling coil 830 subcools the liquid below its saturation temperature. Although three different coils are shown to accomplish submerged condensation, vapor space condensation and liquid subcooling, these functions may be combined in one or multiple cooling coils operating in series or in parallel coolant flow loops. Thus, a single cooling coil may be arranged to provide all three cooling modes, viz., submerged condensation, vapor space condensation and liquid subcooling. Other combinations can also be implemented. Liquid currents are created in the liquid due to bubble 860 motion and condensation or any other means, and these currents direct subcooled liquid towards the boiling surface and improve the heat removal process. When boiling begins, the process shifts from single-phase liquid cooling to subcooled boiling. Depending on local conditions, saturated boiling may occur. The pressure in the boiling chamber depends on the cooling coil capacity as it is balanced by the single-phase heat transfer from the boiling liquid to the cooling coil and the condensation occurring in the vapor space and submerged condensation process. Temperatures on the liquid, vapor, boiling surface, and cooling elements are different at different locations. The pressure in the boiling chamber thus depends on the heat transfer processes, including the dynamic nature of the boiling process, the rate of heat transfer between the cooling element and the liquid and the subcooling attained locally, the rate of submerged condensation of vapor occurring in the liquid, the rate of condensation occurring on the cooling elements if present in the vapor space, the rate of condensation occurring at the liquid-vapor interface between the vapor space and liquid interfaces it is exposed to. The local subcooling provided by the cooling elements to the liquid provides the thermal driver for condensation during the submerged condensation process. The pressure in the boiling chamber can be reduced by increasing the cooling element surface area and cooling element surface temperature exposed to the liquid and vapor in the boiling chamber. This in turn, depends on the coolant temperature and coolant flow rate through the cooling elements. To initiate the boiling process sooner at lower wall superheats, artificial nucleation cavities, porous coating and other nucleating features may be incorporated on the boiling surface. Other enhancement structures, including, but not limited to, microfins with heights from 5 micrometers to 1 mm, finned structures with heights above 1 mm, pin fins and tapered gap manifolds can be incorporated to improve the heat dissipation performance of the boiling surface.

Heat transfer from the device to the cooling coils is enhanced because of the flow of subcooled liquid over the device where boiling takes place. Heat is removed from the device by both sensible heating of the subcooled liquid and heating and evaporation of liquid due to the boiling process. The bubbles encounter subcooled liquid and submerged cooling coil, both of which provide submerged condensation. The cooling coils also provide subcooling to the liquid in the bath. Air and any other non-condensable gases are removed from the vapor space to improve the efficiency of the condensation process. This is preferably done at the time of charging the boiling liquid into the device. The liquid is also preferably degassed to remove the non-condensable gases from within the casing that forms the enclosure. The casing 801 provides the space where the heating and cooling components are enclosed and forms the boiling chamber. The immersion cooling unit used for immersion cooling of computers and servers with boiling is a boiling chamber with boiling and condensation processes occurring therein. The submerged condensation provides an efficient mechanism to remove heat from the device and transfer it to the coolant. Other parts and surfaces of the casing and internal structures may act as the heat generating device or as a cooling coil, depending on their functionality. This concept could be utilized in immersion cooling of objects such as computers, cold plates, CPUs, laser diodes, and other devices that require cooling and can be submerged in a boiling liquid. The boiling liquid is preferably a dielectric fluid when electronic components, such as computers, are being cooled.

Boiling heat transfer is the result of bubble nucleation and growth on a boiling surface. Both these factors affect the heat transfer coefficient and CHF. When the liquid in the boiling chamber that rushes to the boiling surface after a bubble departs in a bubble ebullition cycle is at saturated liquid condition, the bubble grows very rapidly and the heat transfer is very efficient. When the liquid rushing to the boiling surface is subcooled, a higher wall superheat is needed to initiate bubble nucleation and the bubble growth rate is also slowed. This makes the heat transfer inefficient. It is desirable to have saturated boiling conditions at the boiling surface to improve the heat transfer rate.

In an embodiment, the chamber height above the boiling surface is from 5 mm to 5000 mm. In an embodiment, the chamber height above the boiling surface is from 5 mm to 200 mm. In an embodiment, the chamber height above the boiling surface is from 5 mm to 100 mm. In an embodiment, the chamber height above the boiling surface is from 5 mm to 25 mm. In an embodiment, the height of the boiling chamber device above the boiling surface is from 5 mm to 50 mm.

While specific embodiments are described, the concept can be applied to boiling surfaces of different dimensions and boiling chambers of different heights. The concept of coupled submerged and vapor space condensation is an important element. The concept can be used with submerged condensation alone.

FIGS. 13A-13E show examples of a variety of different enhancement features 205 to enhance pool boiling heat transfer in the boiling chamber. These features are implemented on the pool boiling surfaces 201 in the boiling chamber. FIG. 13A shows microchannels, FIG. 13B shows micro-pin fins, FIG. 13C shows a porous coating, FIG. 13D shows a dual taper arrangement in a plan view and FIG. 13E shows conical bubble diverters.

FIGS. 14A-14C show the heating section 101 and different configurations of thermal communication between the external heat source 100 and the liquid containing section 442 of the boiling chamber 200. FIG. 14A shows 442 as the section configured to contain liquid, 441 as the section configured to contain vapor, and 440 as the interface between the two sections, 442 and 441. The heating section is shown as a box with dotted lines. The heating section contains the contact area 105 between the external heating source 100 and the bottom wall 202 of the boiling chamber 200. FIGS. 14B and 14C show two embodiments of the connection between the external heating source with the liquid containing section. The portion of the wall where boiling occurs is shown as the boiling surface 201, which presents a boiling surface 201 to the liquid in the section configured to contain liquid, as shown in FIG. 14B. In the configuration shown in FIG. 14C, at least some portion of the heating surface of the external heating source comes in contact directly with the liquid in the section configured to contain the liquid. The cooling element 210 has the inlet 310 and outlet 320 connections to the external coolant processing unit 300 (not shown in this figure). Proper sealing between the external heating source and the opening of the boiling chamber is required.

The disclosure will be further illustrated with reference to the following specific examples. It is understood that these examples are given by way of illustration and are not meant to limit the disclosure or the claims to follow.

Figure 7:
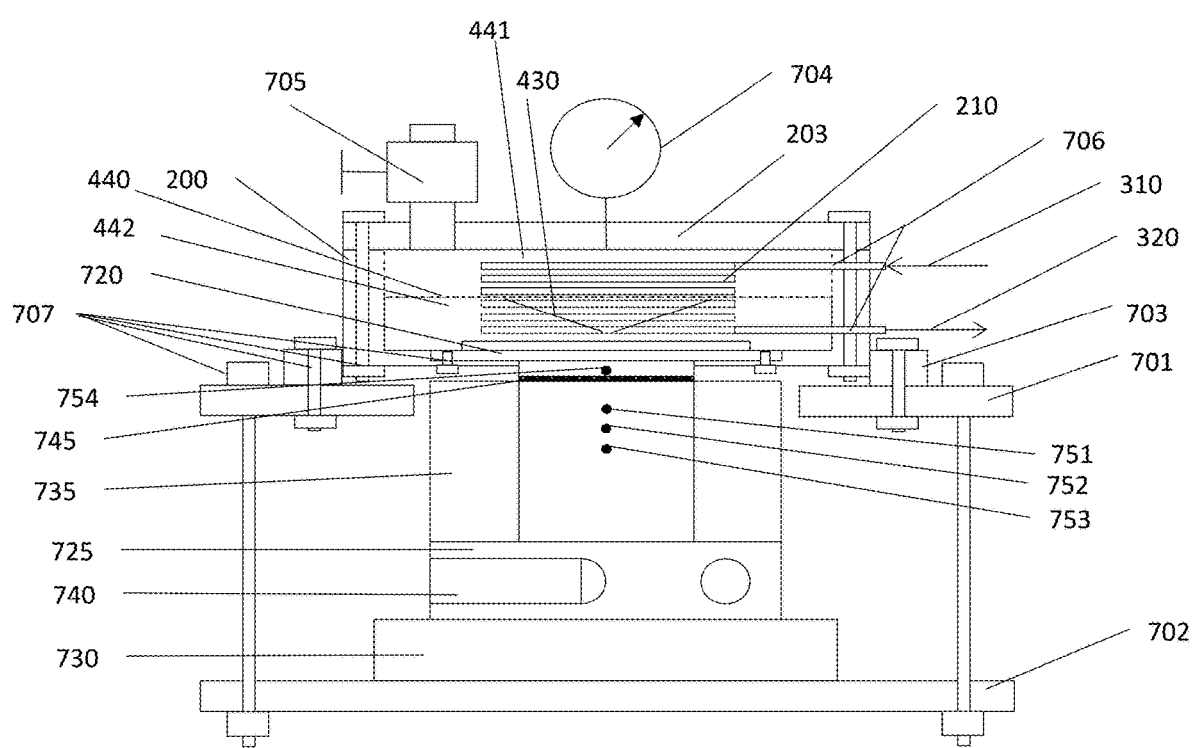
FIG. 7 shows an embodiment of a testing apparatus containing a cooling device of the disclosure.

An exemplary device fabricated to demonstrate the working model of an embodiment of the disclosure is shown in FIG. 7. The aluminum top plate 701 consists of an aluminum bracket 703 to hold the boiling chamber 200. The aluminum bracket is secured to the top plate using four stainless steel socket head screws 707 of 0.112" diameter. The boiling chamber is sealed with the top cover 203 using a gasket and six stainless steel button socket cap screws 707 of 0.164" diameter. A pressure gauge 704 is mounted to measure the pressure on the boiling chamber 200 and a needle valve 705 provides a controlled access to the boiling chamber for charging and discharging working fluid and connecting a vacuum line. The flow inlet from the external cooling system to the cooling coil is shown by 310 and the flow outlet from cooling coil 210 is shown by 320.

Continuing with FIG. 7 description, heat is supplied to the copper heating chip 720 through a copper heating block 725, which has embedded cartridge heaters. The surface of the copper heating chip 720 is also the boiling surface 201. The setup is experimented with two different heating chips 720 to mimic the heater spreading surface atop a microprocessor. A plain copper heating chip was used to experiment boiling chamber with water as the working fluid and a microchannel chip was used to conduct experiments on the boiling chamber 200 with Novec 7000 working fluid. The plain copper heating chip has an average surface roughness of 2.5 μm. The copper heating chip with microchannels has microchannels with 500 μm channel width, 400 μm channel depth, and 200 μm fin width. The plain and microchannel chips are taped with Kapton tape to mark a projected active boiling area of 34.5 mm×32 mm over its surface. The copper heating chip has a hole to insert the thermocouple probe 754. The temperature reading from the thermocouple probe 754 is used to calculate the surface temperature of the copper heating chip. The chips are bolted at the bottom of the boiling chamber using multiple 0.112" diameter stainless steel button socket screws 707. A cooling coil 210 is placed inside boiling chamber 200 such that a portion of the cooling coil is submerged in the liquid section 442 and a portion remains in the vapor section 441. In the present illustration, the height of liquid section 442 was around 10 mm. The condensing coil has a length of around 493 mm and a condensing surface area of 19931 mm² and acts as the is the cooling coil 210 that provides submerged condensation, sub-cooling of boiling liquid, and vapor space condensation. A specific quantity of working fluid, in this case, water or Novec 7000 is charged into the boiling chamber through the needle valve such that a portion of cooling coil and bubble diverter remains submerged into the liquid section 442. A bubble diverter 430 is used to direct the flow of rising bubbles from the boiling process towards the cooling coil. The bubble diverter can be removed to get the data without a bubble diverter.

The copper heater block 725 which supplies heat to the copper heating chip 720 is placed on a ceramic insulation piece 730, which is then placed on an aluminum bottom plate 702. The ceramic insulation reduces the thermal loss from the copper heater block into the aluminum bottom plate and atmosphere. The copper heating block has a stem with a 34.5 mm×32 mm cross-section and consists of holes 751, 752 and 753 to insert thermocouple probes. A garolite insulation 735 is sleeved around the copper heating block to reduce the thermal losses from the steam of the copper heater block into the atmosphere. The lower section of the copper heater block consists of four cartridge heaters 740 of 200 W capacity each. The bottom surface of the copper heating chip is coated with a thermal interface material 745, aligned and mated with the top surface of the copper heater block 725. The top plate and the bottom plate are then secured using four 0.31" diameter hex steel bolts.

DATA ACQUISITION: The pressure gauge attached to the top lid is used to monitor the pressure inside the boiling chamber. The vapor bubble movement inside the boiling chamber is recorded using a Photron high-speed camera at 2000 fps and analyzed using Photron FASTCAM Viewer 3. A heat transfer calculation to find the surface temperature of the boiling surface, heat flux transferred from the surface, and efficiency of heat transfer is shown below.

The thermocouple output is monitored using a National Instruments cDaq-9172 data acquisition system with a NI-9211 temperature module. The thermocouples inserted in holes 751-753 are used to calculate heat flux from the power source to the copper heating chip. The thermocouple probe inserted in the hole 754 is used to calculate the surface temperature of the copper heating chip and heat transfer coefficient. Assuming 1D heat conduction along with the stem of the copper heater block and copper heating chip, heat flux q" is calculated using Fourier's steady-state 1D conduction equation shown below in equation (1).

$$q'' = -k_{Cu} \, dT/dx \qquad (1)$$

where $k_{Cu}$ is the thermal conductivity of copper, and dT/dx is the temperature gradient calculated using the three-point backward Taylor's series approximation.

$$dT/dx = (3T_1 - 4T_2 + T_3)/2\Delta x \qquad (2)$$

Where $T_1$, $T_2$, and $T_3$ are the temperatures from the thermocouple probes inserted in holes 751, 752, and 753 respectively, and $\Delta x$ is the distance between holes 751 and 752.

The boiling surface temperature $T_{Wall}$ can be obtained by using Eq. (1) and (2) and is given by $$T_{Wall} = T\_4 - q''(x\_1/k_{Cu}) \qquad (3)$$

Where $T_4$ is the temperature from the thermocouple probe inserted in the hole 754 inside the copper heating chip, and xi is the distance between the hole 754 and the top surface of the copper heating chip.

The heat transfer coefficient can be calculated as the amount of heat flux transferred for a degree of wall superheat of the boiling surface. It can be expressed as follows:

$$h = q''/(T_{Wall} - T_{Sat}) \qquad (4)$$

Where $T_{Sat}$ is the saturation temperature of the working fluid.

Figure 8:
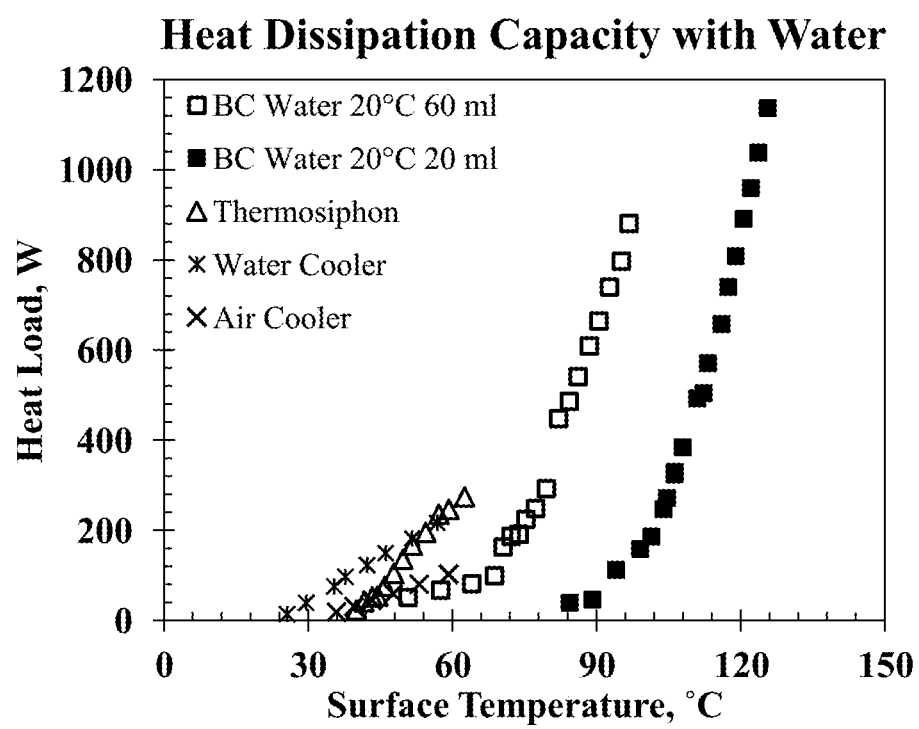
FIG. 8 is a graph showing heat dissipation capacity with water of an embodiment of the boiling chamber compared with other available cooling solutions.

RESULTS: Heat transfer experiments were conducted using the exemplary device shown in FIG. 7. The results generated from these experiments are discussed here. FIG. 8 shows the performance plot of the boiling chamber with the heat load dissipation capacity of the boiling chamber with other available cooling solutions like the air-cooled, water-cooled, and thermosiphon system. Heat load is defined as the heat rate dissipated or heat transferred from the external heat source that enters the heating section with which liquid comes in contact in the boiling chamber. The heat load applied at the boiling surface is plotted on the y-axis, while the boiling surface temperature is plotted on the x-axis. A plain copper heater chip with an active boiling area of 34.5 mm×32 mm was used to mimic a heat spreader over a microprocessor. The experiments with the boiling chamber were conducted using water as the working fluid and two liquid volumes of 20 ml and 60 ml. The result from the 20 ml experiment is shown with hollow square markers and the 60 ml experimental result is shown with solid square markers. Heat transfer to liquid goes through different heat transfer mechanisms of single-phase heat transfer and boiling heat transfer. Compared to other cooling solutions, a boiling chamber with both fill volumes can dissipate significantly higher heat loads while keeping a low surface temperature. It is seen that with a working fluid volume of 20 ml, the boiling chamber can dissipate more than 1100 W of heat while maintaining a surface temperature of less than 125° C. Filling more working fluid in the boiling chamber submerges a greater portion of the condensing coil in it. Thereby, resulting in higher liquid sub-cooling and improved submerged condensation. The combined effect in turn, increases the heat transfer efficiency of the system and the ability to dissipate more than 880 W of heat while keeping the surface temperature below 95° C. The performance can be further improved by increasing condensing area through packaging more condensing coils in the boiling chamber. FIGS. 8-11 show the performance plots of experimental testing on boiling chamber using boiling chamber (BC) with water or Novec 700 dielectric fluid with coolant inlet temperatures of 10° C. and 20° C., a thermosiphon, a water cooler that is available commercially and an air cooler that is available commercially as shown in legends in these figures. The heat load is the heat rate from the external heat source, surface temperature refers to the boiling surface temperature, and the thermal resistance is defined on the basis of heat rate from the external heat source and the temperature difference between the boiling surface and the coolant inlet temperature.

Figure 9:
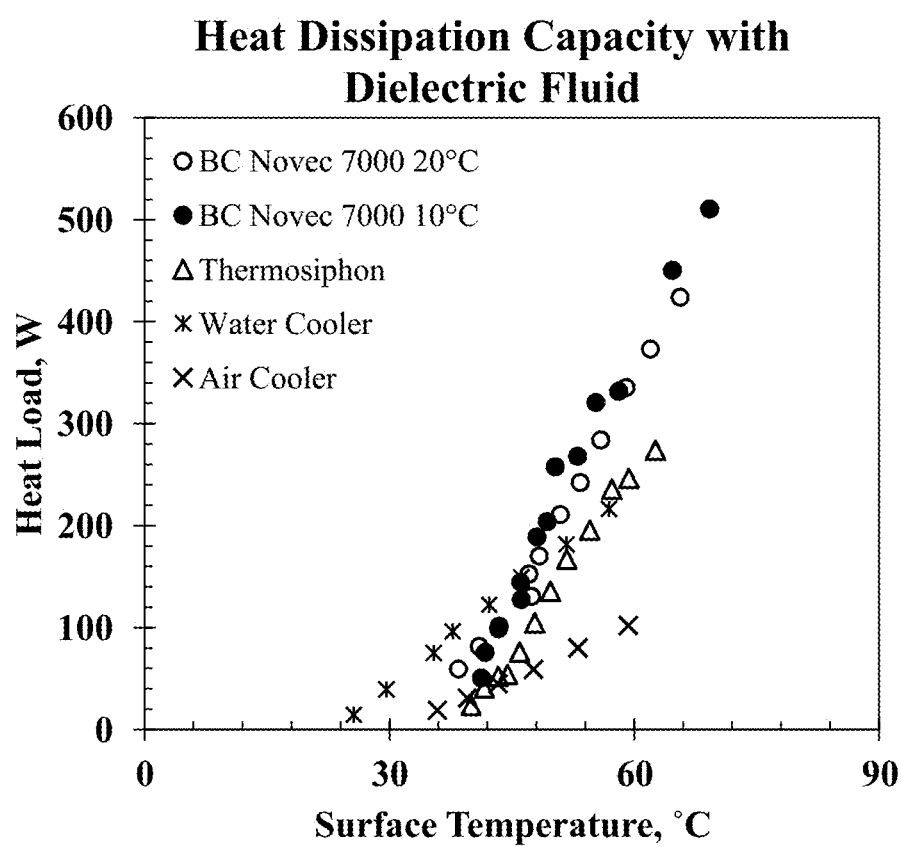
FIG. 9 is a graph showing heat dissipation capacity with dielectric fluid of an embodiment of the boiling chamber compared with other available cooling solutions.

FIG. 9 shows the comparison of superior boiling chamber heat transfer performance compared to the air-cooled, water-cooled, and thermosiphon devices. The plot compares the heat load dissipated at a given surface temperature of boiling surface by boiling chamber when experimented with dielectric fluids. The boiling chamber was filled with Novec 7000 dielectric fluid and tests were conducted with the condensing chiller water flowing in the coils at 10° C. and 20° C. temperature. The result of configuration where in boiling chamber was experimented with 20° C. chiller water is marked in hollow circles and the result of configuration where in 10° C. chiller water temperature is marked in solid circles. The horizontal axis shows the observed surface temperature for a given heat load supplied at the boiling surface as shown on the vertical axis. It is observed that the boiling chamber could dissipate a heat load of 374 W while keeping the surface temperature below 62° C. and 510 W while keeping the surface temperature below 69° C. The heat load enhancement in the boiling chamber is at least greater than 36% at 62° C. surface temperature and greater than 86% at 69° C. compared to the thermosiphon device. The air-cooled and water-cooled devices exhibit severely degraded heat transfer capacity and efficiency compared to a boiling chamber. Inferior thermal properties of dielectric fluids can be associated with similar thermal performance of the boiling chamber even after reducing coolant inlet temperature from 20° C. to 10° C. The heat dissipation rate can be further improved by increasing the condensation coil surface area and coolant flow rate for a given coolant inlet temperature.

Figure 10:
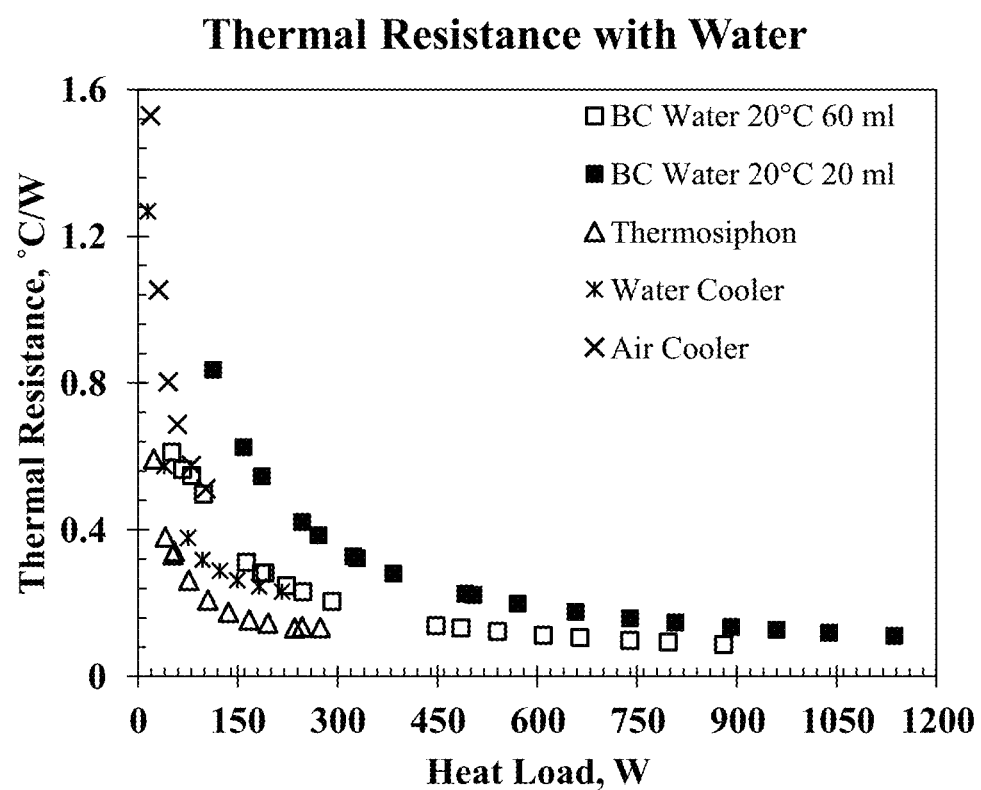
FIG. 10 is a graph showing a comparison of thermal resistance in an embodiment of the boiling chamber when used with water compared with other available cooling solutions.

FIG. 10 shows a comparison of thermal resistance in the boiling chamber when used with water as the working fluid compared to the air-cooled, water-cooled, and thermosiphon devices. Thermal resistance is defined as the temperature difference required to dissipate a given heat load. It is calculated as the temperature difference between the boiling surface and boiling liquid divided by the heat load dissipated by the boiling surface in the heating section. The experimental result of the boiling chamber filled with 60 ml water is shown in hollow square markers and the result of the boiling chamber experiment with 20 ml water fill is shown in solid square markers. The plot shows that with 20 ml working fluid inside the boiling chamber, thermal resistance remains high compared to other solutions. However, increasing the working fluid fill from 20 ml to 60 ml increases the bulk liquid height inside the chamber from approximately 3.4 mm to 10.1 mm, thereby allowing more condensing coil to be submerged in the working fluid. Greater submersion of condensing coils leads to superior sub-cooling and improved heat transfer in the boiling chamber. Hence, the 60 ml working fluid fill configuration generates a thermal resistance that is comparable to other systems at low heat fluxes and lowers with increasing heat load. It is worth noting that when experimented with water as the working fluid, the boiling chamber can operate at low vapor pressures such that the saturation temperature of water reduces below 50° C. and allows the device to show a comparable thermal resistance to other device operating with low saturation temperature dielectric refrigerants.

Figure 11:
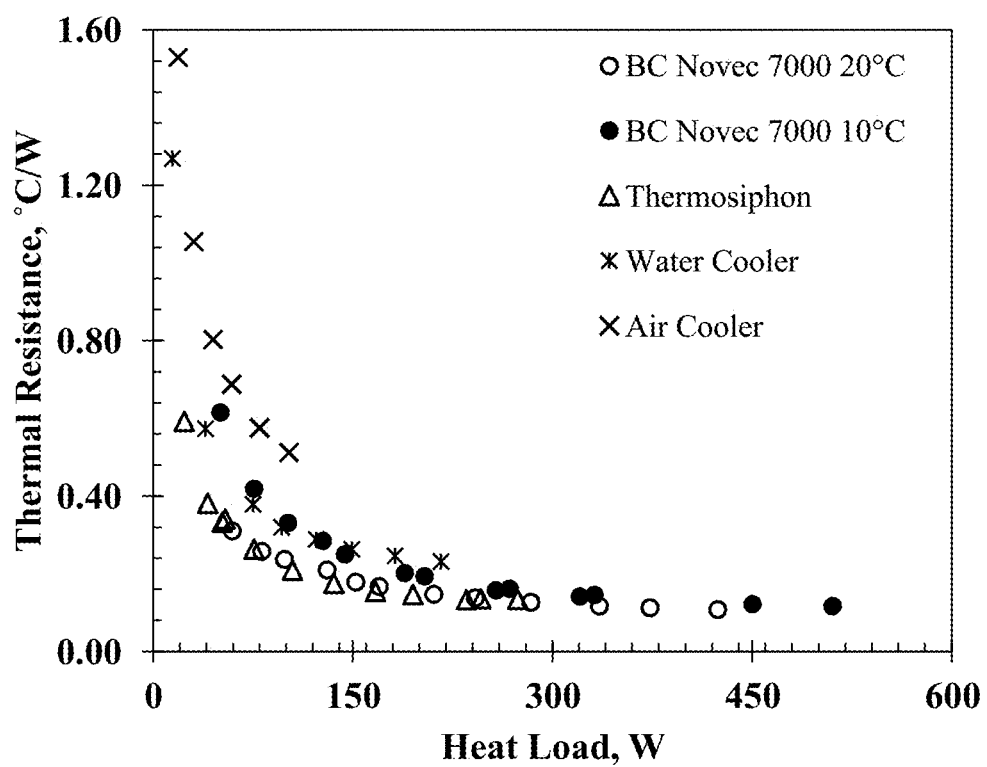
FIG. 11 is a graph comparing submerged condensation thermal resistance of an embodiment of the boiling chamber with other available cooling solutions.

FIG. 11 compares thermal resistance in an air-cooled, water-cooled, and thermosiphon device with the boiling chamber when used with Novec 7000 as the working fluid. The thermal resistance is plotted on the y-axis and the heat load is plotted on the x-axis. The experimental result of the boiling chamber supplied with 20° C. chiller water flowing through the condensing coil is shown in hollow circular markers and the result of the boiling chamber experiment with 10° C. chiller water circulation is shown in solid circular markers. It is observed that both configurations suffer less thermal resistance compared to the water-filled boiling chamber configurations. The thermal resistance in the boiling chamber is similar to that in a thermosiphon loop for heat loads less than 175 W. Beyond which, the boiling chamber exhibits lower thermal resistance. Additionally, the air-cooled and water-cooled devices perform poorly compared to the boiling chamber for all tested heat loads.

Paper Example

Another major improvement can be accomplished by changing the working fluid. It is known that the performance of boiling and condensing devices is significantly improved when water is used as the working fluid. For example, the critical heat flux value for a dielectric fluid is in the range of 10 to 30 W/cm$^2$ at wall superheats in the range of 30° C. to 60° C., whereas the critical heat flux for water on a copper surface is around 120 W/cm$^2$ at a wall superheat of only around 20° C. The performance also depends on the pressure. It is expected that the vapor pressure of water will be lower to provide a lower boiling chamber temperature that will keep the heating surface temperature below the upper limit of operation for electronic devices. Enhancement devices such as open microchannels, feeder microchannels with nucleating regions, dual tapered microgap configuration, and surface features designed to utilize evaporation momentum force in creating separate liquid-vapor pathways have demonstrated an enhancement in boiling CHF and HTC of up to 3-fold and 5-fold increases over a plain copper surface for water. Similar performances are expected with dielectric fluids. The heat load with water in the boiling chamber will increase accordingly and a heat load of at least 1 kW and up to 2 to 3 kW will be dissipated with low thermal resistance with enhanced boiling surface and larger cooling coil surface area and higher coolant flow rates. The cooling coil could be designed to include fins to increase surface area.

Although various embodiments have been depicted and described in detail herein, it will be apparent to those skilled in the relevant art that various modifications, additions, substitutions, and the like can be made without departing from the spirit of the disclosure and these are therefore considered to be within the scope of the disclosure as defined in the claims which follow.

What is claimed:

1. A cooling device, comprising:
a thermally conductive boiling chamber comprising a section configured to contain liquid, a section configured to contain vapor in contact with the section configured to contain liquid, and a heating section comprising a boiling surface in communication with a heat source and the section configured to contain liquid; and
a cooling element configured to communicate with an external cooling source and disposed in at least the section configured to contain liquid and above the boiling surface, wherein when liquid is present in the section configured to contain liquid the cooling element is at least partially submerged and the boiling surface is submerged in the liquid, wherein the liquid that comes in contact with a surface of the cooling element is subcooled and the liquid that comes in contact with the boiling surface is heated resulting in boiling and vapor generation forming bubbles, the bubbles condense in at least subcooled liquid or at least on the surface of the cooling element submerged in the liquid and heat is exchanged between the heat source and the cooling element.

2. The device of claim 1, wherein a closest part of the cooling element to the heat source is less than 15 mm away from a surface of the heat source.

3. The device of claim 1, wherein a closest part of the cooling element to the heat source is less than 30 mm away from a surface of the heat source.

4. The device of claim 1, wherein a closest part of the cooling element to the heat source is less than 50 mm away from a surface of the heat source.

5. The device of claim 1, wherein a portion of the cooling element is in direct contact with a surface of the boiling chamber.

6. The device of claim 1, wherein a height of an enclosed space within the boiling chamber above the heat source is in a range of from 10 mm to 30 mm.

7. The device of claim 1, further comprising pool boiling enhancement features in the boiling chamber.

8. The device of claim 1, further comprising at least one diverter within the boiling chamber configured to divert liquid towards the heating section.

9. The device of claim 1, further comprising at least one diverter within the boiling chamber configured to divert vapor towards the cooling element.

10. A process for dissipating heat, comprising:
heating a first portion of liquid within a partially liquid-filled thermally conductive sealed boiling chamber with a boiling surface in communication with a heat source to generate bubbles;
subcooling a second portion of the liquid with an external cooling source in communication with a cooling element at least partially submerged in the partially liquid-filled boiling chamber; and
condensing the bubbles in at least subcooled liquid or at least on the partially submerged cooling element, thereby exchanging heat between the heat source and the cooling element.

11. The process of claim 10, wherein the heat source dissipates heat at a heat transfer rate in a range of from 50 W to 4000 W in the boiling chamber.

12. The process of claim 10, wherein the heat source dissipates heat at a heat transfer rate of at least 50 Watts in the boiling chamber.

13. The process of claim 10, further comprising directing the bubbles to flow towards the cooling element by at least one diverter within the boiling chamber.

14. The process of claim 10, further comprising diverting the liquid towards the heat source by at least one diverter within the boiling chamber.

15. The process of claim 10, further comprising diverting the bubbles and creating motion of the liquid over the cooling element by at least one diverter within the boiling chamber.

16. The process of claim 10, wherein the liquid is water.

17. The process of claim 10, wherein the liquid is a dielectric fluid.

18. The process of claim 10, further comprising supplementing the external cooling source by an interface with a second external cooling source as part of a secondary cooling loop.

19. The process of claim 10, further comprising maintaining a height of the liquid in the partially filled boiling chamber in a range of from 5 mm to 100 mm.

20. The process of claim 10, further comprising maintaining a percentage of a surface area of the at least partially submerged cooling element exchanging heat with liquid in the boiling chamber in a range of from 10% to 100% of a total surface area of the cooling element.

* * * * *